US006831331B2

(12) United States Patent
Kitamura et al.

(10) Patent No.: US 6,831,331 B2
(45) Date of Patent: Dec. 14, 2004

(54) POWER MOS TRANSISTOR FOR ABSORBING SURGE CURRENT

(75) Inventors: Yasuhiro Kitamura, Chiryu (JP); Toshio Sakakibara, Nishio (JP); Kenji Kohno, Gifu (JP); Shoji Mizuno, Okazaki (JP); Yoshiaki Nakayama, Okazaki (JP); Hiroshi Maeda, Kariya (JP); Makio Iida, Ichinomiya (JP); Hiroshi Fujimoto, Nagoya (JP); Mitsuhiro Saitou, Oobu (JP); Hiroshi Imai, Kariya (JP); Hiroyuki Ban, Aichi-ken (JP)

(73) Assignee: DENSO Corporation, Kariya (JP)

( * ) Notice: Subject to any disclaimer, the term of this patent is extended or adjusted under 35 U.S.C. 154(b) by 0 days.

(21) Appl. No.: 09/945,621

(22) Filed: Sep. 5, 2001

(65) Prior Publication Data

US 2002/0017697 A1 Feb. 14, 2002

Related U.S. Application Data

(63) Continuation of application No. 08/834,386, filed on Apr. 16, 1997, now abandoned, which is a continuation-in-part of application No. 08/748,896, filed on Nov. 15, 1996, now Pat. No. 6,242,787.

(30) Foreign Application Priority Data

| Nov. 15, 1995 | (JP) | 7-297148 |
| Jan. 22, 1996 | (JP) | 8-8699 |
| Aug. 9, 1996 | (JP) | 8-211675 |
| Sep. 20, 1996 | (JP) | 8-250299 |

(51) Int. Cl.[7] .................. H01L 29/76; H01L 27/01; H01L 29/94; H01L 23/58
(52) U.S. Cl. ............... 257/343; 257/347; 257/409; 257/492; 257/493
(58) Field of Search .................. 257/343, 492, 257/493, 336, 409, 347

(56) References Cited

U.S. PATENT DOCUMENTS

| 4,292,642 A | 9/1981 | Appels et al. |
| 4,300,150 A | 11/1981 | Colak |
| 4,422,089 A | 12/1983 | Vaes et al. |
| 4,494,134 A | 1/1985 | Wildi et al. |

(List continued on next page.)

FOREIGN PATENT DOCUMENTS

| EP | 0 069 429 | 1/1983 |
| EP | 0 110 320 | 6/1984 |
| EP | 0 114 435 | 8/1984 |

(List continued on next page.)

OTHER PUBLICATIONS

Efland et al., "An Optimized Resurf LDMOS Power Device Module Compatible with Advanced Logic Processes", 1992 IEEE; IEDM 92, pp. 237–240.

Office Action dated Sep. 2, 2003 regarding Japanese Application H8–250299.

*Primary Examiner*—Steven Loke
(74) *Attorney, Agent, or Firm*—Harness, Dickey & Pierce, PLC

(57) ABSTRACT

A semiconductor device is provided having a power transistor structure. The power transistor structure includes a plurality of first wells disposed independently at a surface portion of a semiconductor layer; a deep region having a portion disposed in the semiconductor layer between the first wells; a drain electrode connected to respective drain regions in the first wells; a source electrode connected to respective source regions and channel well regions in the first wells, such that either the drain electrode or the source electrode is connected to an inductive load; and a connecting member for supplying the deep region with a source potential, where the connecting member is configurable to connect to the drain electrode when the drain electrode is connected to the inductive load and to connect to the source electrode when the source electrode is connected to said inductive load.

10 Claims, 37 Drawing Sheets

U.S. PATENT DOCUMENTS

| | | | |
|---|---|---|---|
| 4,609,929 A | 9/1986 | Jayaraman et al. | |
| 4,626,879 A | 12/1986 | Colak | |
| 4,859,878 A | 8/1989 | Murayama | |
| 4,862,242 A | * 8/1989 | Wildi et al. | 257/343 |
| 4,929,991 A | 5/1990 | Blanchard | 357/23.8 |
| 4,963,951 A | 10/1990 | Adler et al. | |
| 5,014,101 A | 5/1991 | Finney | |
| 5,023,678 A | * 6/1991 | Kinzer | 257/343 |
| 5,072,287 A | 12/1991 | Nakagawa et al. | |
| 5,119,162 A | 6/1992 | Todd et al. | |
| 5,286,995 A | 2/1994 | Malhi | 257/549 |
| 5,304,827 A | 4/1994 | Malhi et al. | |
| 5,326,993 A | 7/1994 | Iwamuro | |
| 5,338,965 A | 8/1994 | Malhi | |
| 5,347,155 A | 9/1994 | Ludikhuize | |
| 5,350,932 A | 9/1994 | Malhi | |
| 5,369,045 A | 11/1994 | Ng et al. | |
| 5,382,536 A | 1/1995 | Malhi et al. | |
| 5,382,818 A | 1/1995 | Pein | |
| 5,395,776 A | 3/1995 | Shibib | |
| 5,485,027 A | 1/1996 | Williams et al. | 257/343 |
| 5,514,608 A | 5/1996 | Williams et al. | |
| 5,517,046 A | 5/1996 | Hsing et al. | |
| 5,525,824 A | 6/1996 | Himi et al. | 257/370 |
| 5,705,842 A | 1/1998 | Kitamura et al. | 257/362 |

FOREIGN PATENT DOCUMENTS

| | | |
|---|---|---|
| EP | 0 267 768 | 5/1988 |
| EP | 0 338 312 | 10/1989 |
| EP | 0 403 449 | 12/1990 |
| EP | 0 420 672 | 4/1991 |
| EP | 0 566 262 A2 | 10/1993 |
| EP | 0 677 876 | 10/1995 |
| JP | 57-078168 | 5/1982 |
| JP | 58-016572 | 1/1983 |
| JP | 59-024550 | 6/1984 |
| JP | 59-119864 | 7/1984 |
| JP | 61-034262 | 8/1986 |
| JP | 62-065382 | 3/1987 |
| JP | 01-050112 | 10/1989 |
| JP | 2-168646 | 6/1990 |
| JP | 02-237062 | 9/1990 |
| JP | 05-267652 | 10/1993 |
| JP | 06-318707 | 11/1994 |
| JP | 07-135248 | 5/1995 |
| JP | 07-245398 | 9/1995 |

* cited by examiner

FIG. 10A  FIG. 10B  FIG. 10C
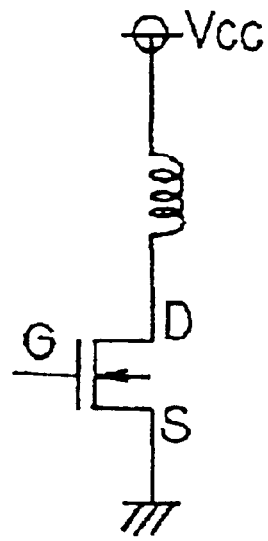
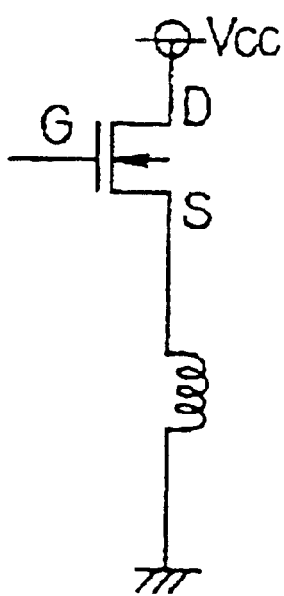
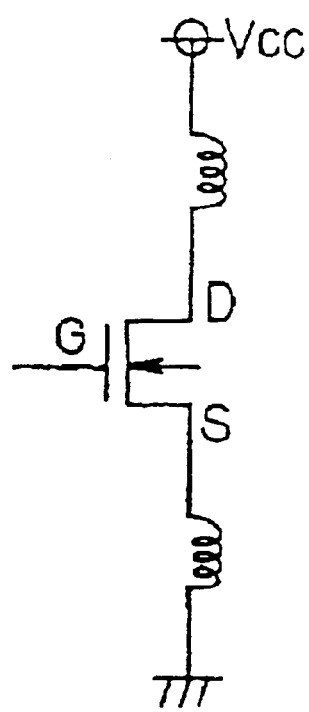
FIG. 10D  FIG. 10E
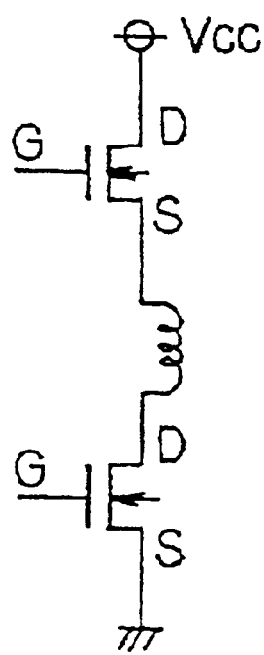
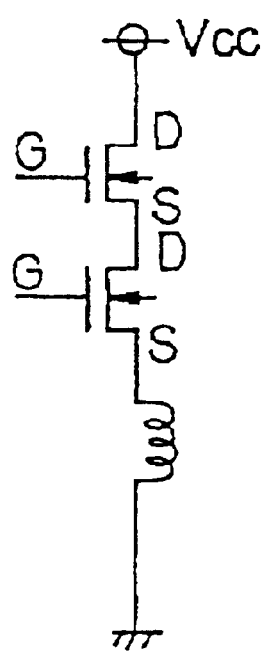

POWER MOS TRANSISTOR FOR ABSORBING SURGE CURRENT

CROSS REFERENCE TO RELATED APPLICATION

This is a Continuation of U.S. application Ser. No. 08/834,386, filed Apr. 16, 1997, now abandoned, which is itself a Continuation-in-part of application Ser. No. 08/748,896, filed Nov. 15, 1996, now U.S. Pat. No. 6,242,787, issued Jun. 5, 2001.

BACKGROUND OF THE INVENTION

1. [Field of the Invention]

The present invention relates to a semiconductor device with a reduced surface field strength type MOS transistor, a method of manufacturing the same semiconductor device, and a semiconductor device with a load driving semiconductor element such as an LDMOS (Lateral Diffused MOS) transistor (which will be referred hereinafter to as an LDMOS), and further an LDMOS (Lateral Double Diffused) transistor such as a power transistor serving as a large-current type switching element.

2. [Description of the Prior Art]

As an N-channel LDMOS there has been known an element with a structure as shown in FIG. 50. As illustrated, this LDMOS has an N-type substrate 1, an N well 2 deposited on the N-type substrate 1, a channel P well 3 formed in the N well 2, an N-type diffused layer 4 formed in the channel P well 3 and a different N-type diffused layer 5 provide in the N well 2. In addition, a gate electrode 7 is located on a substrate surface in a state that a gate oxide film 6 is interposed therebetween while a channel region 8 is formed in a surface area of the channel P well 3 right under the gate electrode 7. In this structure, the N-type diffused layer 4 serves as a source region, the N-type diffused layer 5 acts as a drain region, and the N well 3 under an LOGOS oxide film 9 functions as a drift region. In the illustration, numerals 10 and 11 represent a source electrode and a drain electrode, respectively, numeral 12 designates a diffused layer for taking the electric potential of the channel P well 3, and numeral 13 denotes an inter-layer insulating film.

In the case of such an LDMOS, if the concentration of the N well 2 is heightened in order to reduce the ON resistance to facilitate the current flow, difficulty is encountered to enlarge the depletion layer in the drift region, so that a high breakdown voltage (characteristic bearing a high voltage) becomes unobtainable. On the contrary, if the concentration of the N well 2 falls, although the breakdown voltage improves, the current becomes hard to flow so that the ON resistance increases.

One possible solution of such problems is exemplified by Japanese Patent publication No. 59-24550 and Japanese Unexamined Patent Publication No. 5-267652. The outline of the structure disclosed in these publications is that, as shown in FIG. 51, an N well 2 is formed on a P-type substrate 14. In this case, if the formation of the N well 2 is based on the diffusion, the N well 2 surface shows a high concentration, and hence the flow of the current becomes easy in the N well 2 surface, besides the depletion layer can readily enlarge in the whole N well 2, with the result that a high breakdown voltage is attainable. This LDMOS is called a reduced surface field strength type (RESURF=REduced SURface Field) LDMOS where the dopant concentration in the drift region of the N well 2 is determined to satisfy the so-called RESURF condition as described in the above-mentioned publications.

In the aforesaid reduced surface field strength type LDMOS, the drain electrode 11 and the P-type substrate 14 are in an electrically connected relation to each other, and hence, in cases where as shown in FIG. 52 an L load such as a coil 15 is electrically coupled to the drain electrode 11 so that the L load gets into a driven condition, when the voltage applied to the gate electrode 7 comes into the OFF condition, a reverse voltage of the L load 15 has an influence on the drain electrode 11. This reverse voltage can frequently assume an extremely high value. In this case, since the above-mentioned reduced surface field strength type LDMOS does not take into consideration the current escaping path coping with the reverse voltage, the PN junction between the channel P well 3 and the N well 2 comes into breakdown at the application of the reverse voltage to cause a current to flow from the channel P well 3 through a $P^+$ diffused layer 12 to the source electrode 10 so that the electric potential of the channel P well 3 exceeds the electric potential of the N-type diffused layer 4, with the result that a parasitic (incidental) transistor comprising the N-type diffused layer 4 acting as the emitter, the channel P well 3 serving as the base and the N well 2 functioning as the collector comes into operation to cause a large current to flow through a narrow area in an arrow direction. Because of the occurrence of the large current passing through the narrow area, the elements are easy to heat so that the breakdown of the elements takes place irrespective of a low reverse voltage, thus resulting in impairing the breakdown proof of the elements.

Furthermore, the aforesaid reduced surface field strength type LDMOS is situated on the P-type substrate 14, and hence, in the case that a V-NPN transistor (which will be referred hereinafter to as an NPNTr) superior in current characteristic to a PNP transistor and the aforesaid reduced surface field strength type LDMOS are formed on the same substrate, since an N layer serving as a collector layer in the NPNTr is made to take a deep position, difficulty is actually experienced to form both the transistors on the same substrate. In this case, although, if having the structure as shown in FIG. 50, the LDMOS, together with the NPNTr, can be formed on the same substrate, the compatibility of a high breakdown voltage and a low ON resistance as described before become impossible.

Moreover, there have been proposed various SOI (Silicon On Insulator) structures in which an element area in one main surface side of a semiconductor substrate is divided and separated using an insulating film such as $SiO_2$ to form islands. In this case, elements such as a bipolar transistor and CMOS are formed in the island-like divisions, respectively. The aforesaid power LDMOS is considered to be also formed in the island-like element division. For example, in the case that the LDMOS as shown in FIG. 50 is surrounded by an insulating film, the N-type substrate 1 comes into contact with the insulating film. With this structure, the N-type substrate 1 and the N well 2 becomes common in electric potential to its drain. For this reason, in cases where as shown in FIG. 10A a load is driven by a low side switch type where the load is connected to the power supply side and the LDMOS is coupled to the GND side, in response to the switching of the LDMOS, the drain electric potential varies from the potential of the GND to the potential of the power supply (or more), and the potential of the N-type substrate 1 varies accordingly.

In cases where the element separation is made through the use of the insulating film, since there exists a parasitic capacitor, when the electric potential in the region brought into contact with the insulating film greatly varies, switching noises are propagated up to the other element regions so that the other semiconductor elements can get into malfunction. In the case of the reduced surface field strength type LDMOS as shown in FIG. 51, the P-type substrate 14 comes into contact with the separation insulating film. As illustrated, in order to make the P-type substrate 14 and the source electrode equal in electric potential to each other, the formation of a deep P+ diffused layer for taking the electric potential is necessary. However, in the case that the load is driven by a high side switch type in which as shown in FIG. 10B the LDMOS is connected to the power supply side and the load is coupled to the GND side, in response to the switching of the LDMOS, the source electric potential greatly varies, which can also cause the switching noises.

If, in the SOI structure, elements such as a bipolar transistor and a CMOS of relatively small sizes are formed in the element regions, the aforesaid switching noises does not create a problem. However, in the case of the load driving element such as the LDMOS, the element size increase, thus creating such a problem.

SUMMARY OF THE INVENTION

It is therefore an object of the present invention to provide a reduced surface field strength type LDMOS which is capable of preventing the breakdown of elements at channel forming portions even if its drain undergoes a voltage such as the aforesaid reverse voltage.

Another object of this invention is to form a reduced surface field strength type LDMOS and an NPNTr on the same substrate.

A further object of this invention is to suppress the occurrence of the switching noises when a load driving semiconductor element is provided in an insulated and separated element region.

A further object of this invention is to realize a power MOS transistor having a high surge current withstand.

For the first-mentioned purpose, there is provided a semiconductor device having a reduced surface field strength type MOS transistor in which a semiconductor layer (1) of a first conductivity type supports a first well (16) of a second conductivity type which accommodates a second well (2) of a first conductivity type at a shallower position than the first well (16), and further the second well (2) has a source region (4), a channel region (8) and a drain region (5) therein and a gate electrode (7) is disposed on the channel region (8) so that the second well (2) serves as a drift region, wherein, when a voltage for causing the MOS transistor to be in a non-actuating condition is applied to the gate electrode (7) and a high voltage exceeding a given value is exerted to the drain region, a current-carrying path from the second well (2) through the first well (16) and the semiconductor layer (1) takes place.

Furthermore, the source region (4) and the semiconductor layer (1) are set to be equal in potential to each other. In addition, a parasitic bipolar transistor (18) is formed among the second well (2), the first well (16) and the semiconductor layer (1) to establish the current path. Further, a punch-through occurs between the second well (2) and the semiconductor layer (1) to establish the current path. Still further, a base region (17) is formed to include the source region (4) and to reach the first well (16).

Moreover, there is provided a semiconductor device including a MOS transistor having a source region (4), a channel region (8) and a drain region (5) so that a gate electrode (7) is formed on the channel region and a drift region is set up between the channel region (8) and the drain region (5), wherein a semiconductor layer (1) of a first conductivity type bears a second conductive type first well (16) which in turn accommodates a first conductive type second well (2) at a shallower position than the first well (16), and at least the second well (2) has the drift region and the drain region (5) therein and the source region (4) and the semiconductor region (1) are set to be equal in potential to each other.

According to this invention, the second conductivity type first well and the first conductivity type second well are formed in the first conductivity type semiconductor layer to establish a double-well structure, and the drift region and drain region of the MOS transistor is provided in the second well. In the case that a reverse voltage is applied to the drain region, a current-carrying path is provided in a wide area extending from through the first well and the semiconductor layer. Accordingly, even if such an application of a reverse voltage occurs, this current-carrying path can prevent the breakdown of the elements at the channel formation portions.

For the second-mentioned purpose, there is provided a semiconductor device in which an N-type first semiconductor layer (21a) is divided into first and second element areas so that a reduced surface field strength type MOS transistor (LDMOS) is formed in the first element area while a bipolar transistor (NPNTr) is formed in the second element area in a state that the first semiconductor layer (21a) serves as its collector layer, wherein in the first element area a P-type first well (16) is formed in the first semiconductor layer (21a), an N-type second well (2) is formed in the first well (16) to be shallower than the first well (16) to further accommodate a source region (4), a channel region (8) and a drain region (5), and a gate electrode (7) is located on the channel region (8), so that the reduced surface field strength type MOS transistor is made in a state that the second well (2) acts as a drift region.

Furthermore, an N-type second semiconductor layer (21b) is formed under the first semiconductor layer (21a) and an N-type deep layer (26) is formed which extends from a surface of a substrate to the second semiconductor layer (21b), with the source region (4) and the first semiconductor layer (21a) being set to be equal in potential to each other in such a manner that the potential depends upon the deep layer (26) and the second semiconductor layer (21b).

According to this invention, the P-type first well and the N-type second well are formed in the N-type semiconductor layer to make a double-well structure, thus establishing a reduced surface field strength type MOS transistor. Accordingly, this MOS transistor, together with the NPNTr using the N-type semiconductor layer as the collector layer, can be situated on one substrate.

Still further, in accordance with this invention, there is provided a method of manufacturing a semiconductor device so that in a semiconductor substrate including an N-type semiconductor layer (21a) divided into first and second element areas a reduced surface field strength type MOS transistor (LDMOS) is formed in the first element area while a bipolar transistor (NPNTr) is formed in the second element area, which comprises the steps of performing ion-implantation for the semiconductor layer (21a) to form a P-type first well and an N-type second well (2), performing simultaneous diffusion to form the first well (16) and to form the second well (2) in the first well (16) so that it takes a shallower position than the first well (16), forming a source region (4), a channel region (8) and a drain region (5) within the second well (2), and forming a gate electrode (7) on the channel region (8) to form the MOS transistor (LDMOS) in which the second well (2) serves as a drift region. In addition, the bipolar transistor (NPNTr) is formed in the second element area in a state that the semiconductor layer (21*a*) acts as a collector layer.

According to this invention, in the manufacturing method of producing the reduced surface field strength type MOS transistor and the NPNTr on the same substrate, the first and second wells are produced by the simultaneous diffusion, with the result that only one mask is required for the formations of the first and second wells.

In the above description, the references within the parentheses signify the corresponding relation to the concrete means in embodiments which will be explained later.

Still further, in accordance with this invention, there is provided a semiconductor device in which a load driving semiconductor element is formed in a insulated and separated element region and an electric potential fixing region for surrounding the semiconductor element is defined between the semiconductor element and an insulating film. Because of surrounding the semiconductor element by the electric potential fixing region, the electric potential variation at the load driving is suppressible to control the occurrence of the switching noises.

In addition, there is provided a semiconductor device in which, when a reverse voltage is applied to a drain region, a current-carrying path is formed to extend from a second well through a first well, a first semiconductor layer and an electric potential fixing region. The formation of this current-carrying path can prevent the breakdown of the elements in the channel formation section at the application of the reverse voltage. Further, the first well is set to be equal in electric potential to the source. This enables further suppressing the occurrence of the switching noises at the electric potential variation.

Furthermore, in the case that an MOS transistor is used for the high side switch type, the electric potential fixing region is connected to the power supply, and when the MOS transistor is used for the low side switch type, the electric potential fixing region is coupled to the ground. In this case, if the electric potential fixing region is made to be selectively coupled to one of the power supply and the ground, one of the low side switch type and the high side switch type can freely undergo selection.

Moreover, in accordance with an aspect of the present invention, on a semiconductor substrate a surface portion of a second conductive well region adjacent to source and drain cells is connected as a surge current absorption section to a drain terminal, and a surface portion of a first conductive well region adjacent to the surge current absorption section is connected as a surge current draw (extraction) section to a source terminal, wherein the resistance between the surge current absorption section and the surge current draw section is set to be lower than the resistance between the source and drain cells and the surge current absorption section. Whereupon, as shown in FIG. 51 the surge current brought from the output terminal (drain) flows laterally through a parasitic diode D3 produced by both the well regions and discharges to the source terminal side after passing through the first conductive well region (the surge current draw section). Thus, the surge current does not flow in the source region present on a surface of the source and drain cells so that the protection of a MOS channel section is possible to enhance the withstand against the surge such as static electricity, with the result that a power MOS transistor with a high surge withstand is realizable.

In addition, if a second conductive impurity diffusion region is formed in the surge current absorption section of the second conductive well region with a higher impurity concentration than that of the second conductive well region and at a position deeper than that of a second conductive impurity diffusion region in a drain cell so that a break voltage lower than an element breakdown voltage is obtainable, at a voltage lower than the element breakdown voltage the surge current can discharge to the source terminal side through the first conductive well region.

In accordance with another aspect of the present invention, second conductive deep semiconductor regions extending in a depth direction from the surface side of a semiconductor substrate are made to scatter in the interior of a source and drain cell formation region so that the deep semiconductor regions define a surge current path. With this structure, as shown in FIG. 20 the surge current coming from the output terminal (drain) discharges through the scattering deep semiconductor regions (226*a*, 226*b*, 226*c*) in addition to the parasitic diode due to both the well regions. That is why all the surge currents dispersedly or separately flow without gathering at the drain, and hence no surge current flow in the source region present on the surface, thus protecting the MOS channel section to improve the withstand against the surge such as static electricity. This allows a power MOS transistor with a high surge withstand.

In accordance with a different aspect of the present invention, a second conductive semiconductor buried layer is formed under a first conductive well region in a semiconductor substrate and further second conductive deep semiconductor regions extending in the depth direction from the surface side of the semiconductor substrate and reaching the semiconductor buried layer are made to scatter in the interior of source and drain cells so that a surge current path is defined by the semiconductor buried layer and the dep semiconductor regions. With this structure, as shown in FIG. 17 the surge current introduced from the output terminal (drain) flows vertically through a parasitic transistor created by both the well regions and the semiconductor substrate and gets out through the semiconductor buried layer (207) and the deep semiconductor regions (226*a*, 226*b*, 226*c*). Moreover, as shown in FIG. 20 the surge current brought from the output terminal (drain) discharges through the scattering deep semiconductor regions (226*a*, 226*b*, 226*c*) in addition to the parasitic diode developed by both the well regions, so that the surge current dispersedly flows without all concentrating in the drain. That is why no surge current flows in the source region in the surface, and the protection of the MOS channel section is possible, thus enhancing the withstand against the surge such as static electricity, which realizes a power MOS transistor with a high surge withstand.

In addition, the aforesaid deep semiconductor regions are disposed around the source and drain cell formation region grouped into a plurality of blocks. Further, the deep semiconductor regions are disposed in the form of islands within the source-drain cell formation region. Still further, preferably, the source and drain cell formation region interposed between the deep semiconductor regions is less than 200 mm in width. Besides, the deep semiconductor regions are made to have plane structures producing band (or strip)-like configurations, and are provided within the source and drain cell formation region to extend in parallel to each other at a given interval.

BRIEF DESCRIPTION OF THE DRAWINGS

The object and features of the present invention will become more readily apparent from the following detailed description of the preferred embodiments taken in conjunction with the accompanying drawings in which:

FIGS. 10A to 10E are illustrations of circuit arrangements for driving a load using an LDMOS;

DETAILED DESCRIPTION OF THE INANITION

Figure 1:
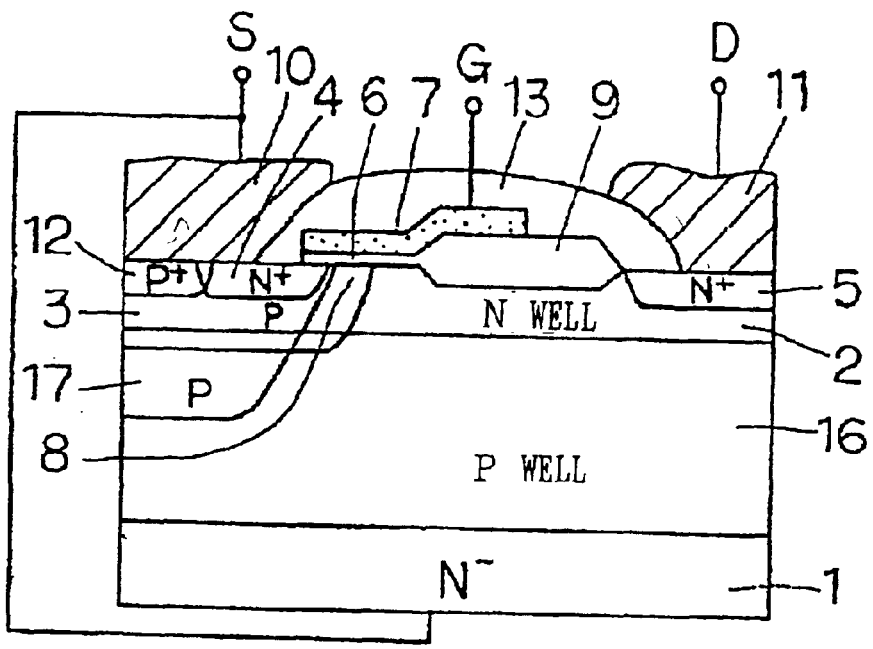
FIG. 1 is a cross-sectional view showing a reduced surface field strength type LDMOS according to a first embodiment of the present invention.

Referring now to the drawings, a description will be made hereinbelow of embodiments of the present invention.

FIG. 1 is a cross-sectional view showing a structure of a reduced surface field strength type LDMOS according to a first embodiment of the present invention. In this embodiment, as shown in FIG. 1 a P well 16 is disposed on an N-type Substrate and an N well 2 is formed in the P well 16 to thereby produce a double-well structure, with a source electrode 10 and the N-type substrate 1 being made to be equal in electric potential to each other. In a drift region of the N well 2, the dopant concentration is set to satisfy the so-called RESURF condition. Further, In the illustration, parts marked with the same reference numerals as those in FIGS. 8 and 9 have the same or corresponding structures.

Figure 2:
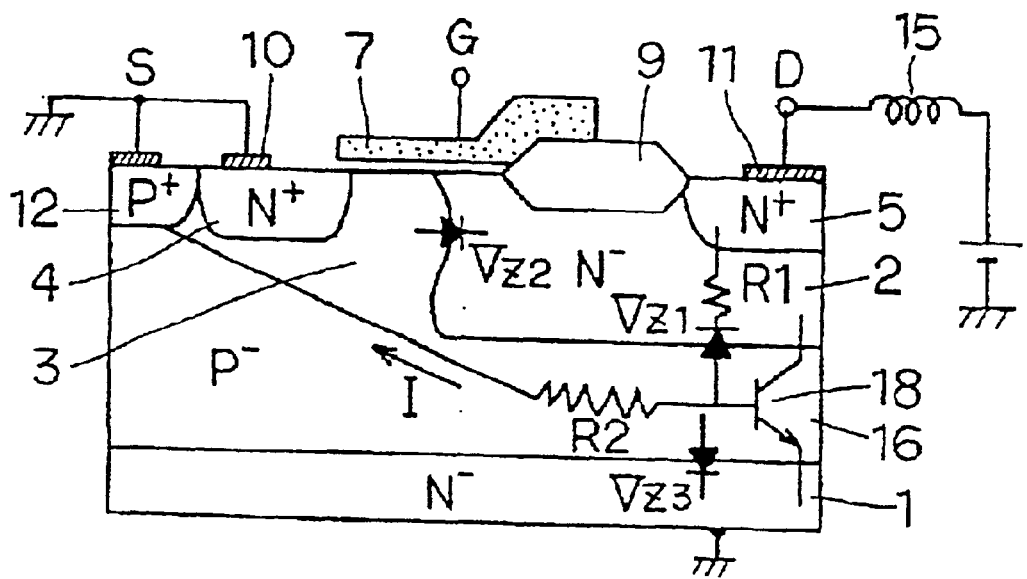
FIG. 2 is an illustration of the FIG. 1 structure useful for describing an operation at the application of a reverse voltage.
Figure 3:
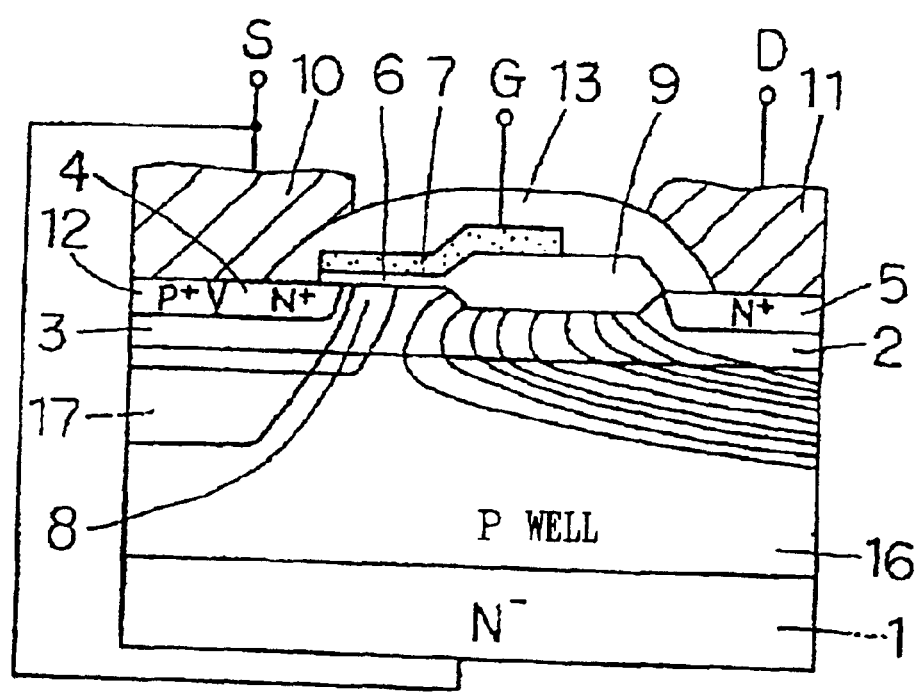
FIG. 3 an illustration of the FIG. 1 structure available for explaining a potential state at the application of a reverse voltage.

The reduced surface field strength type LDMOS as shown in FIG. 1 has a high breakdown voltage and a low ON resistance and can prevent the breakdown of the channel formation portions at the time of the application of a reverse voltage occurring when an L load comes into connection with a drain electrode, as will be described with reference to FIG. 2. In the case that the L load 15 is connected to the drain electrode, if the voltage to be applied to a gate electrode 7 is lowered to make a switch-off condition, the drain electrode 11 is subjected to a reverse voltage. In this case, although there exists a parasitic diode VZ1 made between the N well 2 and the P well 16 and a parasitic diode VZ2 established between the N well 2 and a channel P well 3, the parasitic diode VZ1 first gets into breakdown. That is, this application of the reverse voltage establishes the electric potential distribution in the N well 2 and the P well 16 as shown in FIG. 3 where the electric potential gradient in the vertical direction, i.e., toward the substrate becomes greater than that in the horizontal direction from the drain region 5 to the source region 4, and that is why the breakdown of the parasitic diode VZ1 first occurs. In this case, the voltage within the P well 16 rises due to the presence of a resistor R2 so that a parasitic diode VZ3 between the P well 16 and the N-type substrate 1 comes into its On state and a parasitic bipolar transistor 18 made up of the N well 2, the P well 16 and the N-type substrate 1 takes its ON state, thus making a current flow in the direction of the substrate with a wide area. For this reason, the current can be dispersed to suppress the heating due to the current flow, with the result that the breakdown of the elements at the channel formation portions having a low breakdown voltage characteristic is avoidable, besides the breakdown voltage characteristic of the elements improves.

Furthermore, a base 17 is provided to include the source region 4 and to reach the P well 16 so that a current I flows from the P well 16 to the source side. This further makes the current hard to flow at the channel formation portions. Incidentally, in cases where a sufficient current can flow through a current-carrying path toward the substrate, the base 17 does not need to be provided.

Although in the above-described structure the current is made to flow toward the substrate by means of the parasitic bipolar transistor 18, if the P well 16 has a sufficiently thin configuration in the direction of the substrate, the current can flow toward the substrate by the punchthrough without depending on the parasitic bipolar operation.

Figure 4:
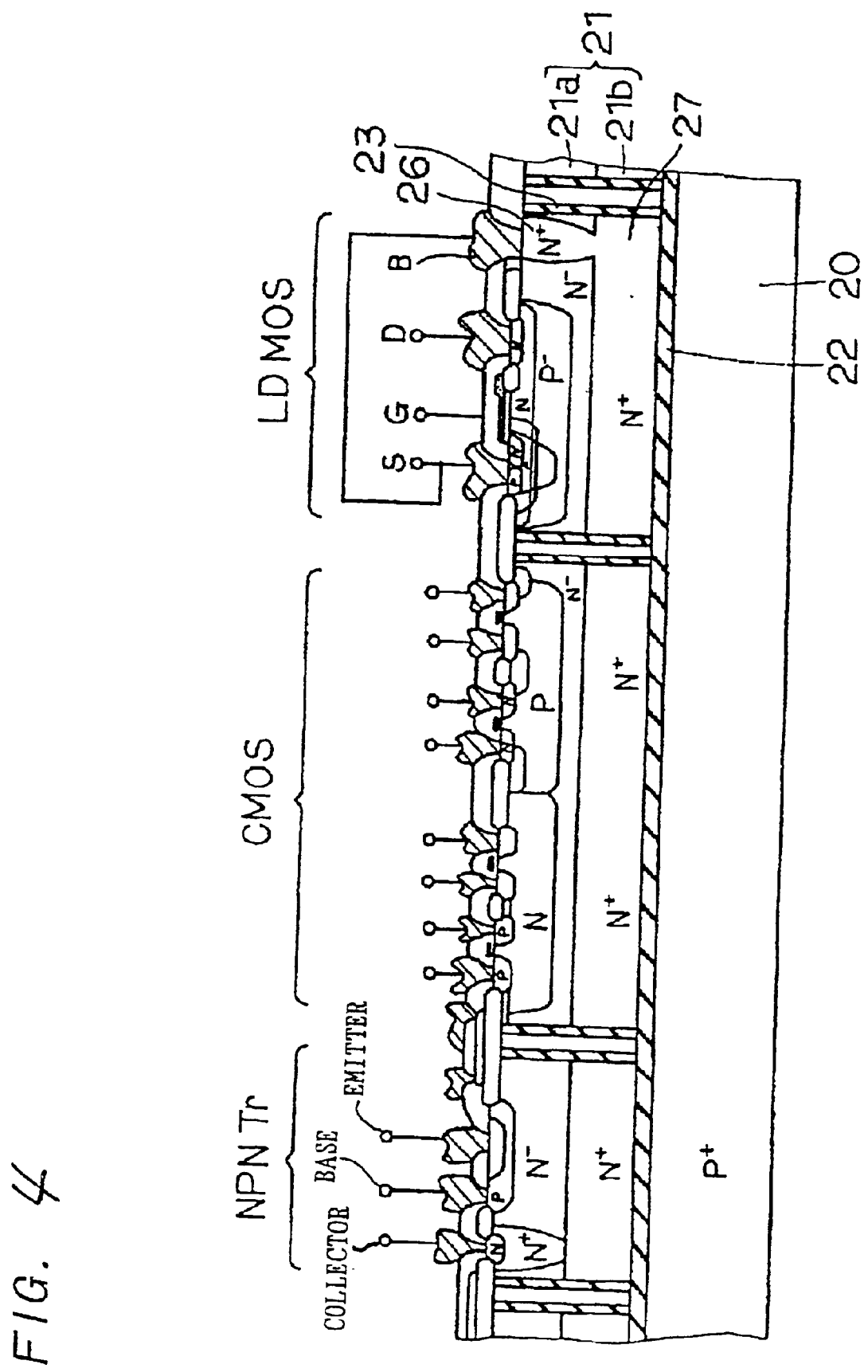
FIG. 4 is a cross-sectional view showing a structure in which the FIG. 1 LDMOS, a CMOS and an NPNTr are formed on the same substrate.

FIG. 4 shows a structure where the above-mentioned reduced surface field strength type LDMOS, together with a CMOS and an NPNTr, is formed on one substrate. The FIG. 4 structure is an SOI (Silicon On Insulator) structure. More specifically, an N-type substrate 21 made by forming an N⁻ layer (corresponding to the N-type substrate 1 in FIG. 1) 21$a$ on an N⁺ substrate 21$b$ and a P-type substrate 20 are adhered through an insulating film 22 such as SiO$_2$ to produce a substrate, and trench grooves 23 are made in that substrate and oxide films are provided within the trench grooves 23 to define a plurality of element-separated element regions so that the LDMOS, the CMOS and NPNTr are formed in the element regions, respectively.

Figure 5A:
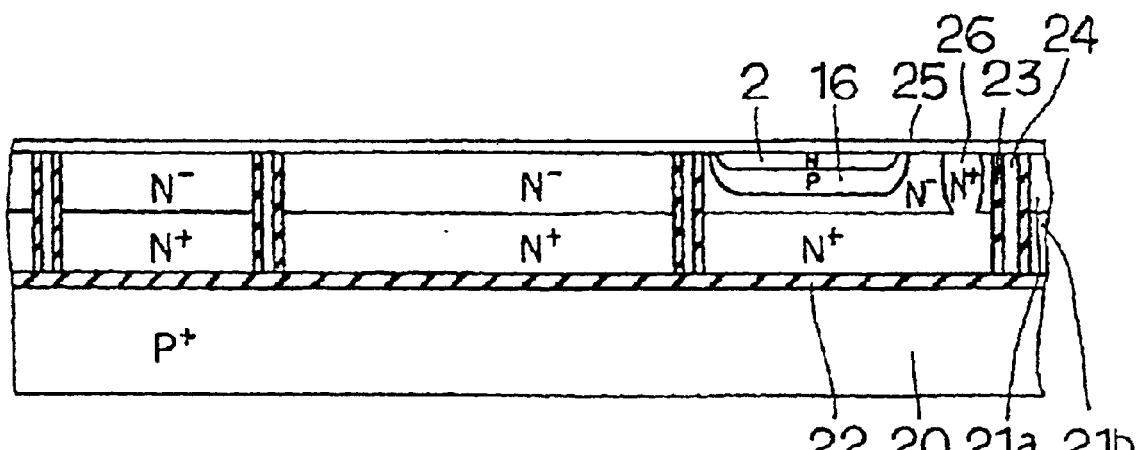
FIGS. 5A to 5C are illustrations for describing a manufacturing method of the device as shown in FIG. 4.

A method of manufacturing the FIG. 4 device will be taken hereinbelow with reference to FIGS. 5A to 5C and 6A to 6C. First of all, the trench grooves 23 are made in the above-mentioned adhered substrate prepared so that the oxide films are formed within the trench grooves 23 and further a polycrystalline silicon 24 is buried therein. In this state, an oxide film 25 appears on the N-type substrate 21 surface. Further, as shown in FIG. 5A, a deep N⁺ layer 26 is formed in the LDMOS formation area, and subsequently the ion implantation is done to produce the P well 16 and the N well 2, moreover the simultaneous diffusion is carried out. In this case, a boron (B) is employed for the P well, while arsenic (As) is used for the N well. Owing to the difference between the diffusion coefficients thereof, the P well reaches a deep position whereas the N well remains at a shallow position. In this step, since the simultaneous diffusion of the boron and the arsenic takes place, the number of the masks necessary therefor is one.

For the ion implantation, the boron dose is $3 \times 10^{12}$ to $1 \times 10^{13}$ atom/cm², and the arsenic dose if $3 \times 10^{12}$ to $1 \times 10^{13}$ atom/cm². Further, in the case of diffusing the implanted ions, the drive-in is done at a temperature of 1200° C. for approximately 600 minutes. In addition, as the condition for the RESURF structure, the impurity concentration in the depth direction from the N well layer 2 surface to the PN junction made together with the P well layer 16 is expressed according to the following equation (1).

$$\int_0^{xj} Nd(x)dx < 1 \text{ to } 2 \times 10^{12} \text{cm}^{-2}$$

where Nd(x)dx represents an impurity concentration per unit volume, x designates the depth, and xj depicts the PN junction depth of the N well layer 2 and the P well layer 16.

Figure 5B:
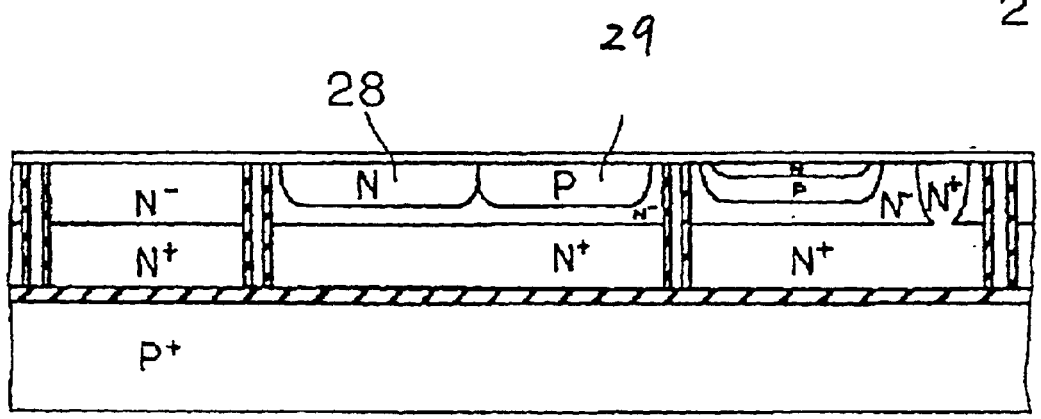
Figure 5C:
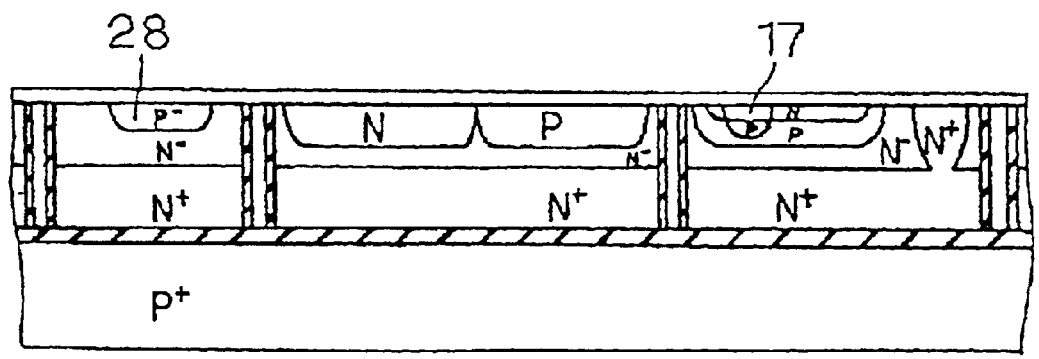

Secondly, as shown in FIG. 5B the ion implantation is performed in the CMOS formation area to produce a P well 29 and an N well 28, before diffused. Thereafter, as shown in FIG. 5C the ion implantation is carried out in the NPNTr formation area to produce a base 28 through the drive-in. At this time, if necessary, a base 17 is also provided in the LDMOS formation area in like manner.

Figure 6A:
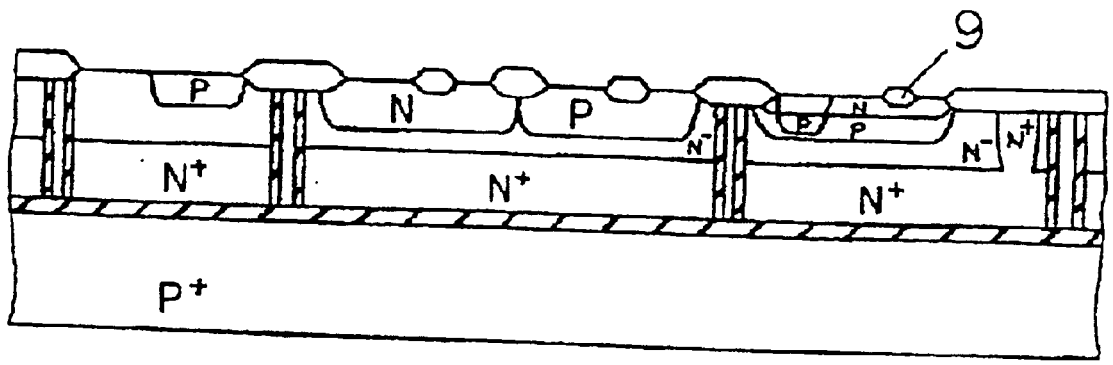
FIGS. 6A to 6C are illustrations of manufacturing steps subsequent to the manufacturing steps as shown in FIGS. 5A to 5C.
Figure 6B:
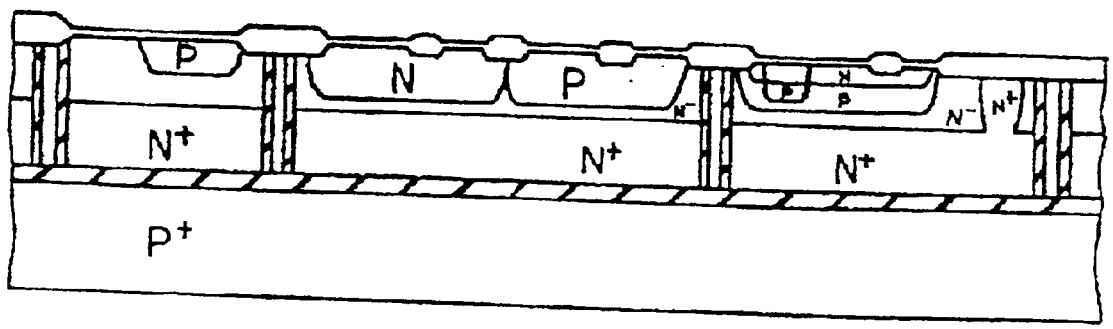
Figure 6C:
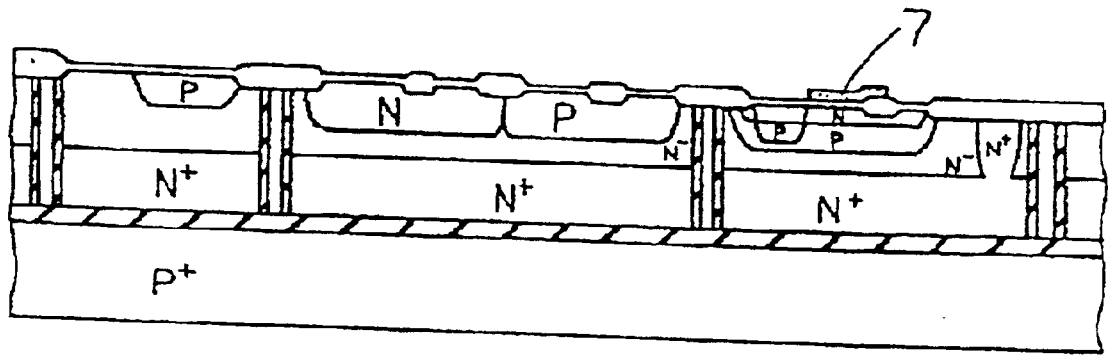

Furthermore, as shown in FIG. 6A the operation comes into the LOCOS oxidization whereby an LOCOS oxide film 9 is formed in the LDMOS formation area, and subsequently the oxidization of the substrate surface is carried out to produce a gate oxide film 6 of the LDMOS (FIG. 6B). In addition, Poly Si is formed in the substrate surface and phosphorus is doped, and further the photoetching processing for the patterning is performed to form a gate electrode 7 of the LDMOS (FIG. 8C). Thereafter, the LDMOS, the CMOS and NPNTr are successively formed through common element formation steps, finally obtaining the structure as shown in FIG. 4. Incidentally, in the LDMOS formation area, the gate is used as a mask so that the channel P well 8 and the source region 4 are diffusion-formed in the N well 2.

Through the use of the above-described manufacturing method, there was produced a reduced surface field strength type LDMOS where the length of the LOCOS oxide film was 2 mm, the uppermost surface concentration of the P well 6 was $8 \times 10^{15}$ to $2 \times 10^{16}$/cm³, the uppermost surface concentration of the N well 2 was $3 \times 10^{16}$ to $6 \times 10^{16}$/cm³, and the depth of the N well 2 was approximately 1.5 to 2.0 mm. In this case, the breakdown voltage between the source and the drain could assume approximately 70 to 80V and the breakdown voltage between the N well 2 and the P well 16 could result in being approximately 65V.

In the above-mentioned reduced surface field strength type LDMOS, the P-type first well and the N-type second well are formed in the N-type semiconductor layer 21 to produce a double well structure, with the result that the reduced surface field strength LDMOS, together with the NPNTr using the N-type semiconductor layer 21 as its collector layer, can be formed on the same substrate.

Figure 7:
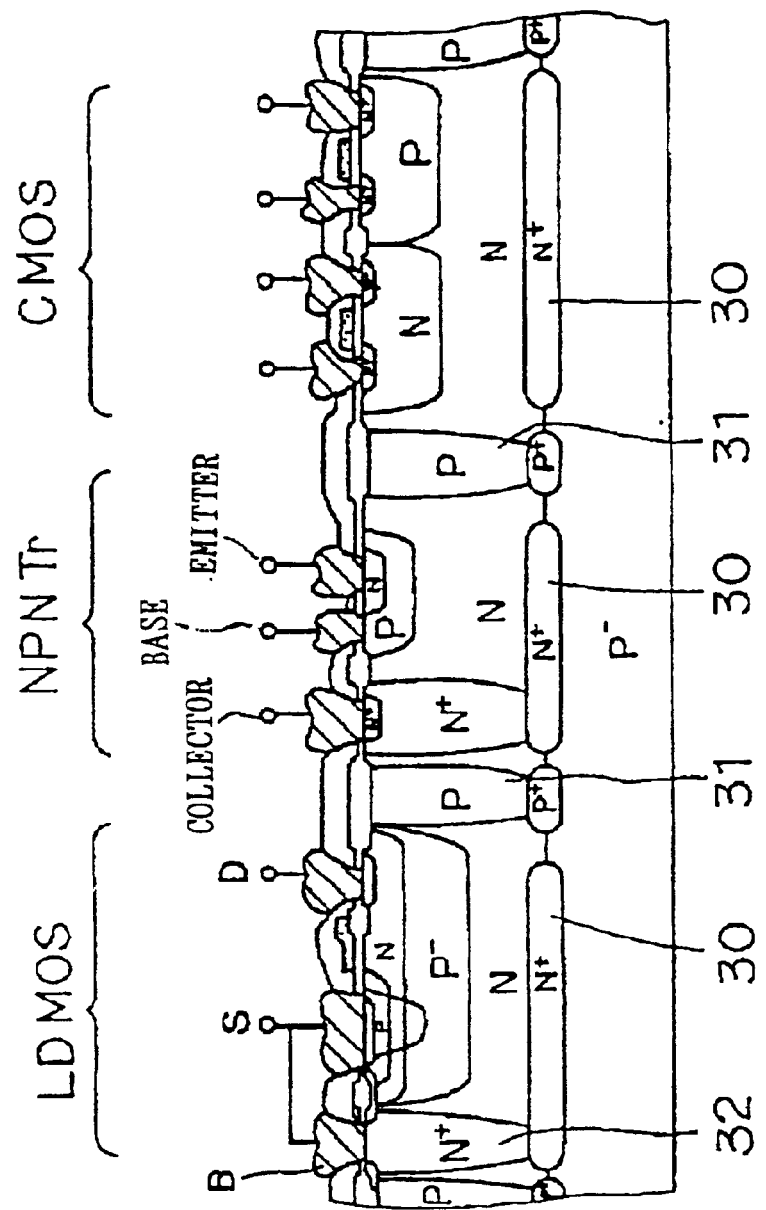
FIG. 7 is a cross-sectional view showing a device according to another embodiment of this invention.

Although in FIG. 4 the SOI structure is employed and the element separation is made using the insulating film 22 and the trench grooves 23, it is also possible that the element separation is accomplished using element separation buried layers 30 and element separation P layers 31 as shown in FIG. 7.

Figure 51:
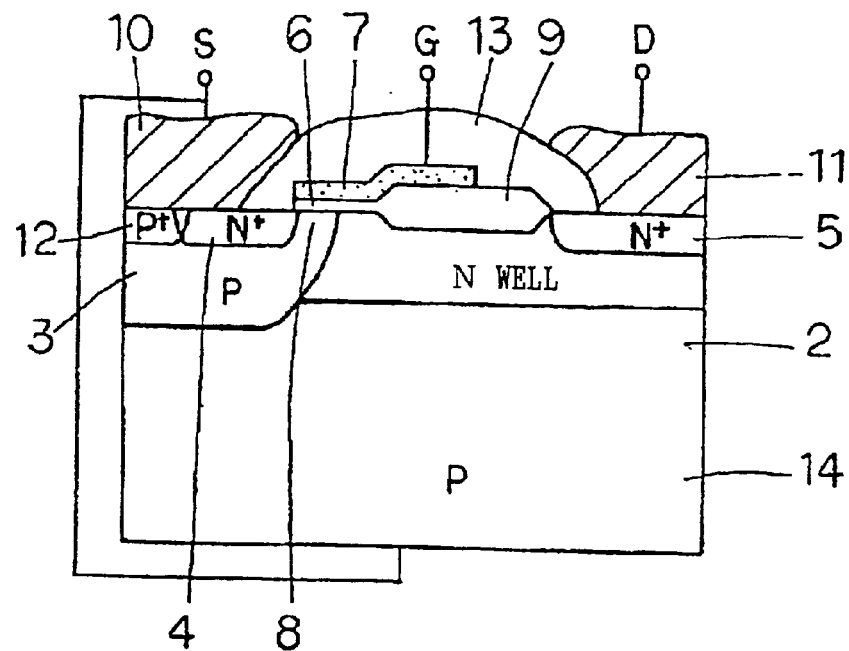
FIG. 51 is a cross-sectional view showing, a structure of a prior reduced surface field strength type LDMOS.
Figure 52:
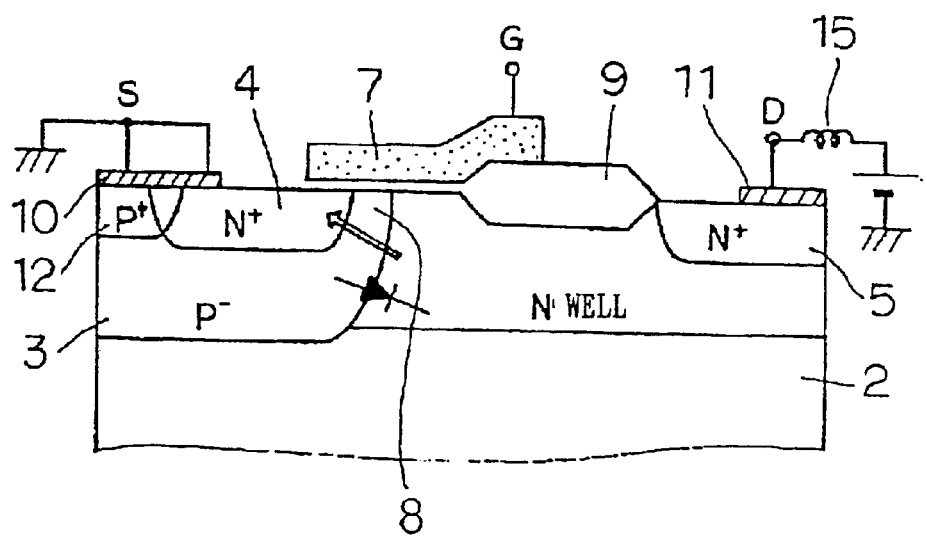
FIG. 52 is an illustration for explaining problems arising at the application of a reverse voltage.

In the LDMOS as shown in FIG. 4 or 7, when the path for leading the breakdown current toward the substrate at the occurrence of the reverse voltage is set up so that as shown in FIG. 4 the current passes through an $N^+$ diffused layer 27 brought into contact with the insulating layer 22 and the deep $N^+$ layer 26 and further flows from a bottom electrode B located on the substrate surface to the ground or as shown in FIG. 7 the current flows through the buried $N^+$ layer 30 and a deep $N^+$ layer 32 and further exits from a bottom electrode B to the ground, in addition to the above-mentioned effects the following effects are attainable. That is, even in the case of the prior reduced surface field strength type LDMOS as shown in FIG. 51, if the adjustment is made of the distance of the drift region from the drain region 5 to the channel P well 3 or the concentration and depth of the N well 2, when a reverse voltage causing that a reverse bias is made between the drain region 5 and the channel P well region 3 is applied to the drain electrode 11, it is considered that the current flows toward the substrate as well as the above-described embodiment. However, in the case that like the LDMOS shown in FIG. 4 or 7 the breakdown current is made to flow from the substrate surface to the ground, although there is the current-carrying path to the bottom electrode as shown in FIG. 4 or 7, a larger current-carrying path is made in the channel P well 3 with a short current path. For this reason, as mentioned in the Description of Prior Art a large current due to the parasitic transistor finally flows through the channel region, with the result that, even if the reverse voltage is low, the elements in the substrate surface can break down due to the heat. Thus, in the case that as shown in FIG. 4 or 7 the breakdown current is made to flow from the substrate surface to the ground, the N-type layer is provided under the P well 16 to produce the parasitic transistor toward the substrate and the current flow is established using a conductivity type N layer different from the channel P well. In this case, the breakdown current does not flow through the channel P well, and hence the breakdown of the elements due to the heat in the vicinity of the substrate surface is avoidable. Incidentally, as another example of the electrode on the substrate surface, there is a bump electrode used for flip chips or the like. This can exhibit the same effects.

Figure 8:
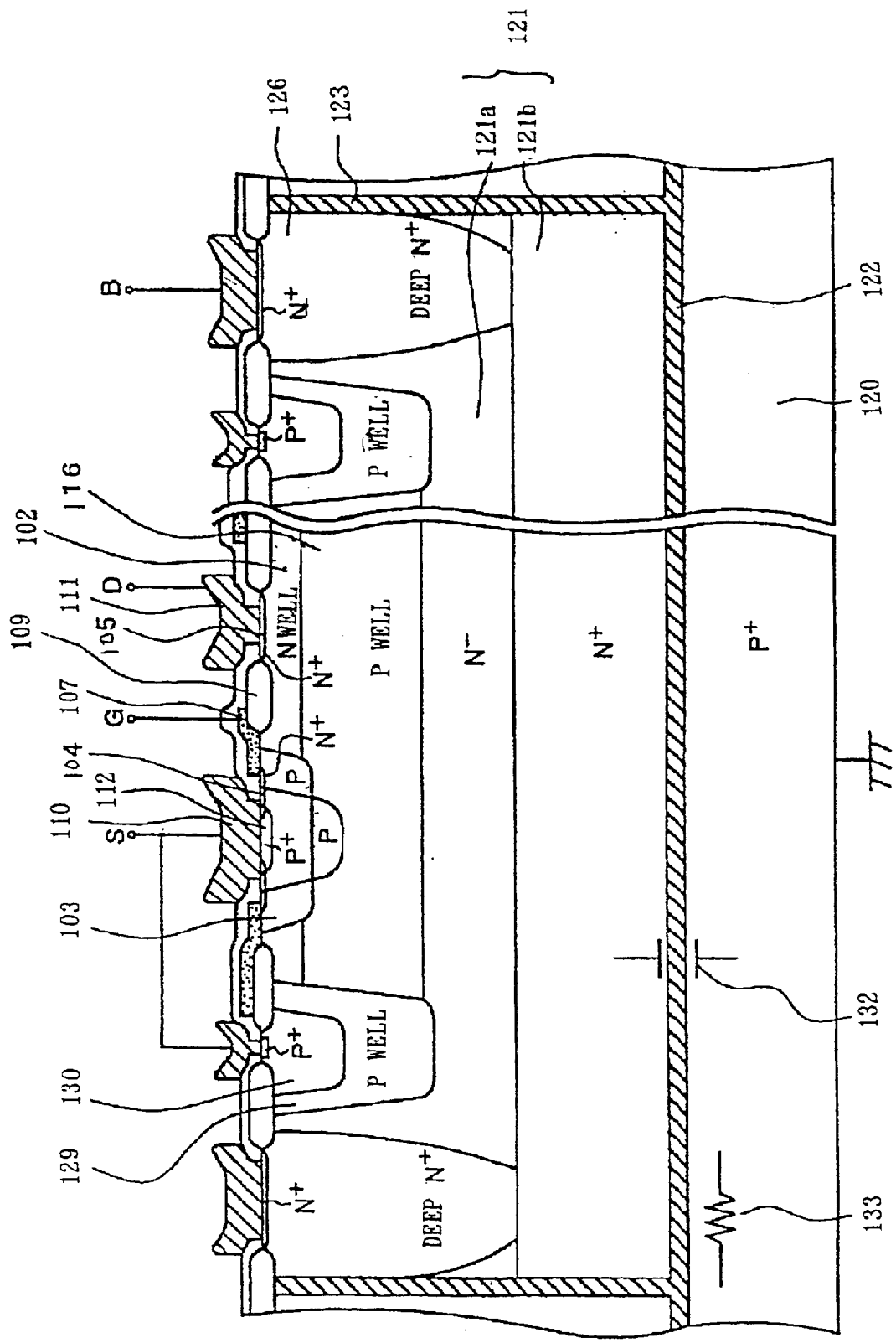
FIG. 8 is a cross-sectional view showing a structure of a semiconductor device including a reduced surface field strength type LDMOS according to a second embodiment of the present invention.
Figure 9:
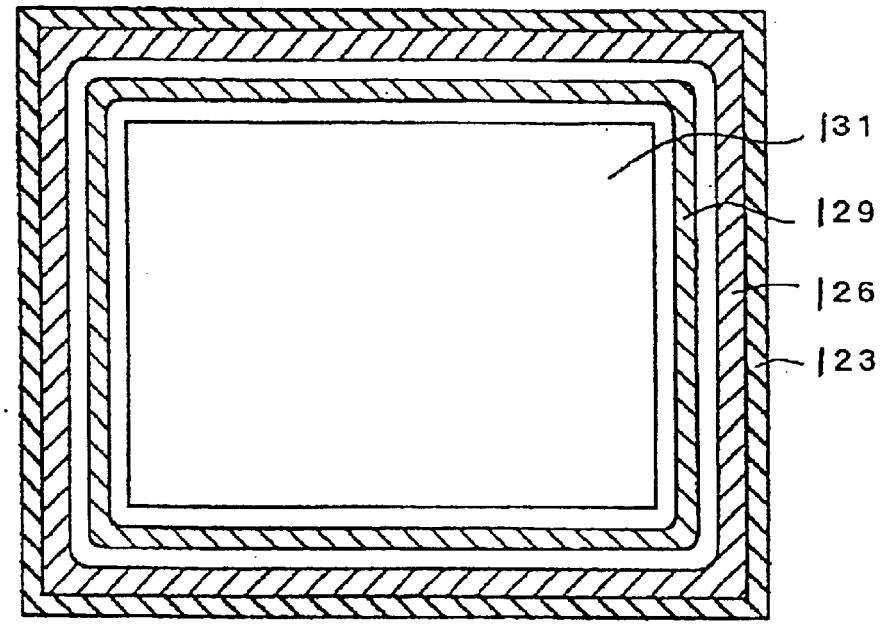
FIG. 9 is a plan view showing the FIG. 8 reduced surface field strength type LDMOS.

Moreover, a description will be made hereinbelow of a concrete structure of a reduced surface field strength type LDMOS formed in an insulated and separated element region according to a second embodiment of the present invention. FIG. 8 is a cross-sectional view showing the structure of the reduced surface field strength type LDMOS according to this embodiment, where the portion other than a deep $N^+$ diffused layer 126 d $N^+$ substrate 121b corresponds to the reduced surface field strength type LDMOS showing in FIG. 1. The elements 103–107 and 109–112 in FIG. 8 respectively correspond to elements 3–7 and 9–12 in FIGS. 1–3. In the FIG. 8 structure, a P well 129 and a base 130 are provided in order to fix the electric potential of a P well 116 to the source electric potential. FIG. 9 is a plan view showing the structure shown in FIG. 8. In an element region separated and formed by an oxide film 123 to have an island-like configuration, there is provided a cell region 31 in which a plurality of LDMOS each described above are formed (more specifically, source regions and drain regions are alternately disposed to form a grating-like configuration and gates are located therebetween). Around the cell region 131 there is provided the P well 129 for fixing the electric potential of the P well 116 to the source electric potential. In addition, the deep $N^+$ diffused layer 126 is provided around the P well 129 to come into contact with the oxide film 123.

A bottom electrode B is connected to the deep $N^+$ diffused layer 126, and the electric potential of this bottom electrode B is fixed to fix the electric potentials of the deep $N^+$ diffused layer 126 and the $N^+$ substrate 121b. In an insulating film 122, as shown in FIG. 8 there exists a parasitic capacitor 132, while fixing the electric potentials of the deep $N^+$ diffused layer 126 and the $N^+$ substrate 121b can suppress the variation of the electric potential of a P-type substrate 120 even if the LDMOS performs its switching operation.

In the case that the load is driven by the low side switch type as shown in FIG. 10A, the bottom electrode B is connected to the GND. In this case, as described above, when a reverse voltage is applied to a drain electrode 111, a current flows toward the substrate. This current passes through the $N^+$ substrate 121b and the deep $N^+$ diffused layer 126 and exits from the bottom electrode B. Further, in the case that the load is driven by the high side switch type as shown in FIG. 10B, the bottom electrode B is connected to the power supply. Accordingly, even with the low side switch type or the high side switch type, the electric potential of the bottom electrode B is fixed so that the occurrence of the switching noises is suppressible. Moreover, in the case that as shown in FIG. 10C loads are respectively coupled to both the ends of the LDMOS, the bottom electrode B is connected to the power supply.

In addition, in the case that as shown in FIG. 10D two LDMOSs are respectively provided in the high and low sides for driving a load, in the LDMOS in the high side its bottom electrode B is connected to the power supply, whereas in the LDMOS in the low side its bottom electrode B is coupled to the GND. Further, in the case that as shown in FIG. 10E two LDMOSs are provided in the high side to drive a load, both are connected to the power supply.

Figure 13:
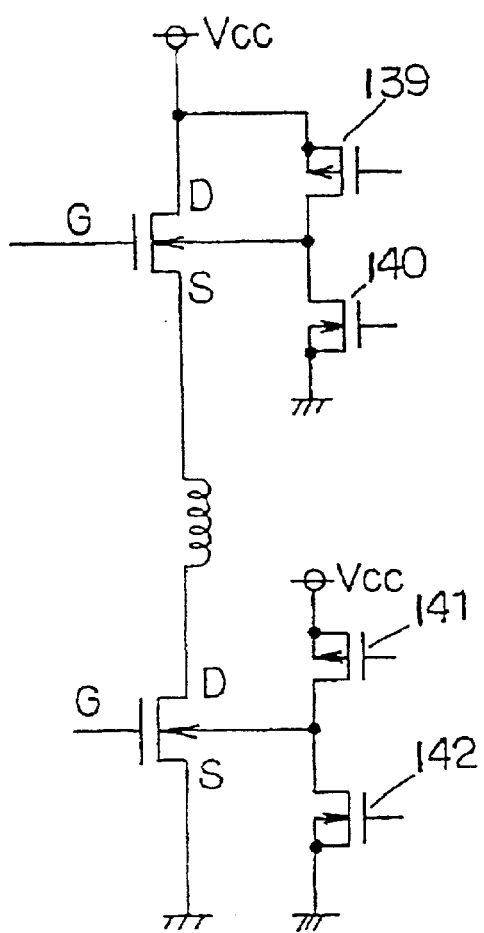
FIG. 13 shows a further example which allows an LDMOS to be selectively used for any one of a low side switch type and a high side switch type.
Figure 11:
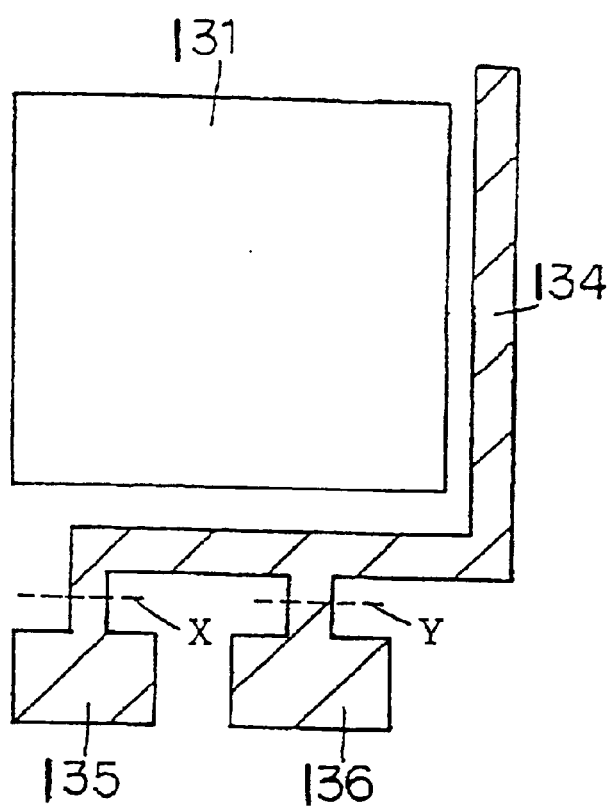
FIG. 11 shows an example which allows an LDMOS to be selectively used for any one of a low side switch type and a high side switch type.
Figure 12:
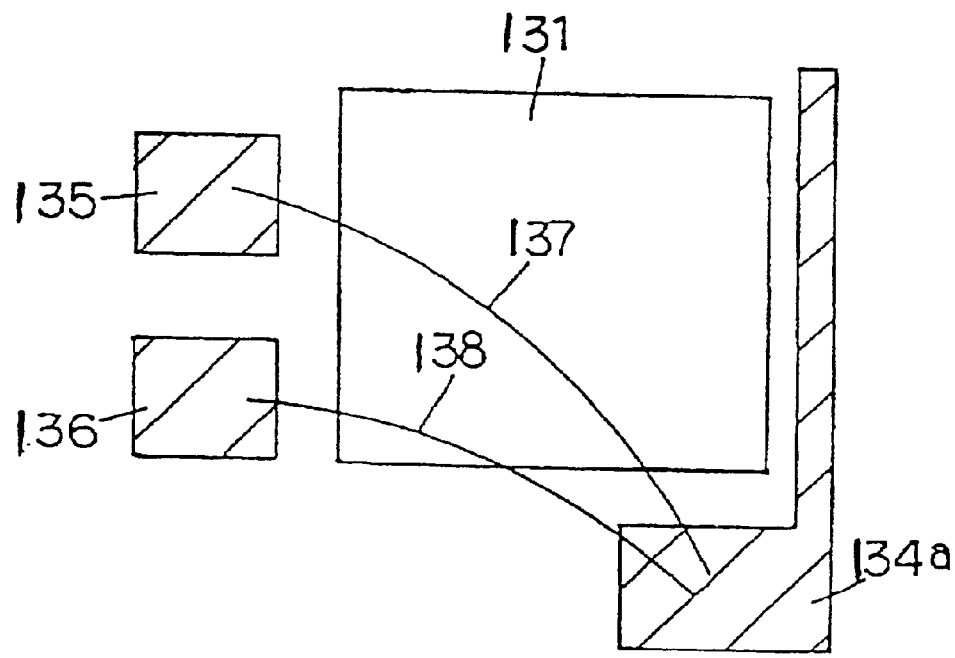
FIG. 12 shows another example which allows an LDMOS to be selectively used for any one of a low side switch type and a high side switch type.

For the connection of the bottom electrode B to the power supply or the GND, the pattern of the bottom electrode B is designed so that the bottom electrode B is previously connected to the electrode pattern of the power supply or the GND. In this case, if using the following structure or arrangement, the LDMOS can freely selected between the low side switch type and the high side switch type. That is, for example, as shown in FIG. 11 an electrode pattern 134 of a bottom electrode B is formed to be connected to an electrode pad 135 of a source electrode and further to an electrode pad 136 of a drain electrode. With this structure, one of the low side switch type and the high side switch type can be selected in such a manner that a portion is cut by the trimming along one of dotted lines X and Y. More specifically, if a portion of the electrode pattern 134 is cut along the dotted line A, the bottom electrode B is connected to the drain side, i.e., the power supply to establish the high side switch type. On the other hand, if being cut along the dotted line B, the bottom electrode B is connected to the source side, i.e., the GND to produce the low side switch type. It is also possible that the electrode pattern 134 of the bottom electrode B is previously coupled through fuses to the electrode pads 135, 136 of the source electrode and the drain electrode and then one of the fuses is melted to be cut to select one of the high side switch type and the low side switch type. Further, it is also appropriate that as shown in FIG. 12 an electrode pad 134a of the bottom electrode B is wire-bonded through a wire 137 or 138 to an electrode pad 135 of a source electrode or an electrode pad 136 of a drain electrode to establish the low side switch type or the high side switch type. Still further, it is also possible to set the electric potential of the bottom electrode B through the use of an MOS transistor. For example, in relation to the arrangement shown in FIG. 10D, electric potential selection MOS transistors 139 to 142 are provided as shown in FIG. 13 so that the MOS transistors 139 and 142 are brought into the ON states while the MOS transistors 140 and 141 are set to the OFF conditions. With this arrangement, the bottom electrode B of the LDMOS in the high side can be connected to the power supply whereas the LDMOS in the low side can be connected to the GND. In this instance, in place of the MOS transistor, a bipolar transistor can also be used as the transistor for the selection of the electric potential. In FIG. 13, for an easy understanding of the circuit, the bottom electrode B is illustrated like a back gate.

In the P-Type substrate 120 there exists a substrate resistor 133 as shown in FIG. 8. However, if the impurity concentration of the P-type substrate 12 is heightened (approximately $1 \times 10^{18}$ cm$^{-3}$ to $1 \times 10^{20}$ cm$^{-3}$) to lower the substrate resistance so that the current can easily flow from the P-type substrate 120 to the GND, the influence of the switching noises is reducible. Further, although the above-described embodiment uses the reduced surface field strength type LDMOS as show in FIG. 1, this invention is applicable to the LDMOSs shown in FIGS. 14 and 15 and other power semiconductor elements. Still further, the LDMOS is not limited to the N-Channel type but can be of the P-Channel type.

Figure 14:
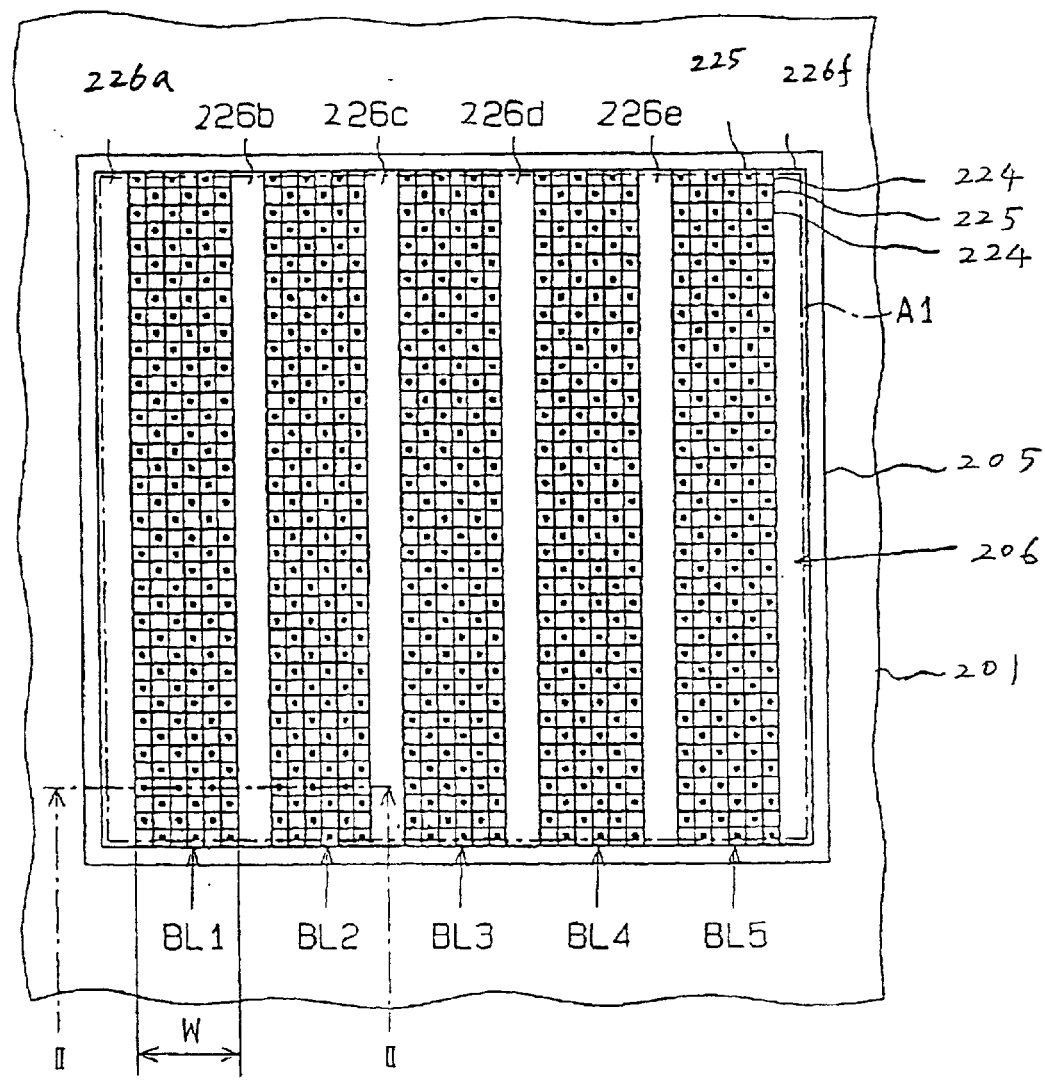
FIG. 14 is a plan view showing a structure of a power MOS transistor according to a third embodiment of the present invention.

Referring now to FIG. 14, a description will be made hereinbelow of a third embodiment of the present invention.

Figure 15:
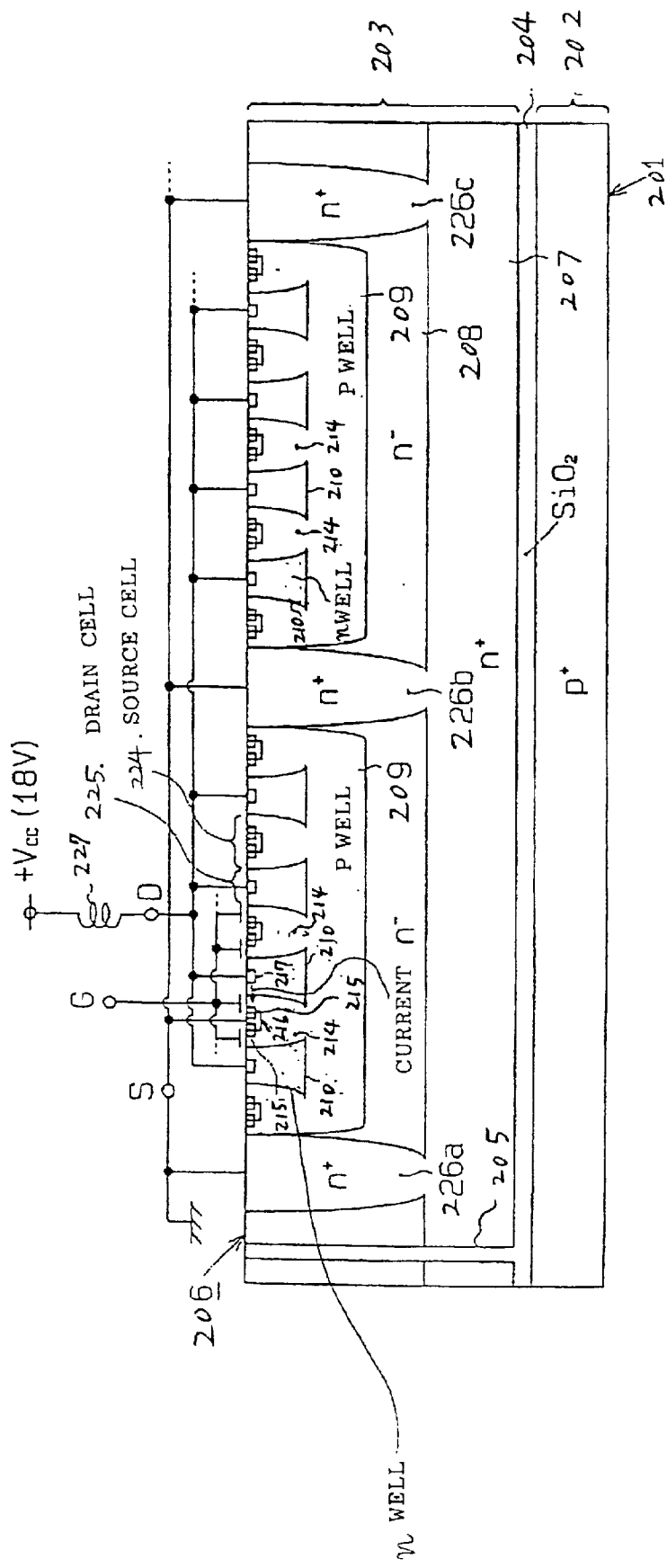
FIG. 15 is a cross-sectional view taken along a line II—II of FIG. 14.

FIG. 14 is a plan view showing a structure of power MOS transistor according to this embodiment and FIG. 15 is a cross-sectional view taken along a line II—II of FIG. 14, that is, shows a cross section of a silicon chip 201 serving as semiconductor substrate. In this embodiment, islands are produced and defined through an SOI (Silicon On Insulator) structure and a separation structure based on a trench oxide film. Formed within an island is a lateral power MOS transistor which is the n-channel type. Incidentally, a device incorporating this transistor is applicable to a controller for motor vehicles and a battery (18V) mounted on a motor vehicle is used as a power supply therefor.

In FIG. 15, a p$^+$ silicon substrate 202 and an n-type silicon substrate 203 are joined with each other by lamination in a state where a silicon oxide film (buried oxide film) 204 is interposed therebetween, thus producing an SOI structure. In addition, within the n-type silicon substrate 203 a trench oxide film 205 is formed to extend from its surface to the buried oxide film 204, and a silicon region surrounded by the trench oxide film 205 and the silicon oxide film (buried oxide film) 204 is defined as a transistor formation island 206.

In the n-type silicon substrate 203, an n$^-$ epitaxial layer 208 is formed on an n$^+$ buried layer 207. More specifically, the n$^+$ buried layer 207 is formed using antimony (Sb) to have a thickness of approximately 207 mm while the n$^-$ epitaxial layer 208 is formed to have a carrier concentration of approximately $10^{15}$ cm$^{-3}$ and the corresponding region constitutes a device formation region. Thus, the silicon chip 201 has a laminated structure comprising the buried oxide film 204, the n$^+$ buried layer 207 and the n$^-$ epitaxial layer 208 piled up in order on the p$^+$ silicon substrate 202.

Furthermore, a p well region is generated in a surface section of the n$^-$ epitaxial layer 208 and further an n well region 210 is created in the p well region 209. In more detail, through the ion implantation of boron (B) and arsenic (As) and the thermal diffusion, both the well regions 209, 210 are created by the double diffusion so that the n well region 210 has a depth of approximately 1 mm and the p well region 209 has a depth of approximately 4 mm.

Figure 16:
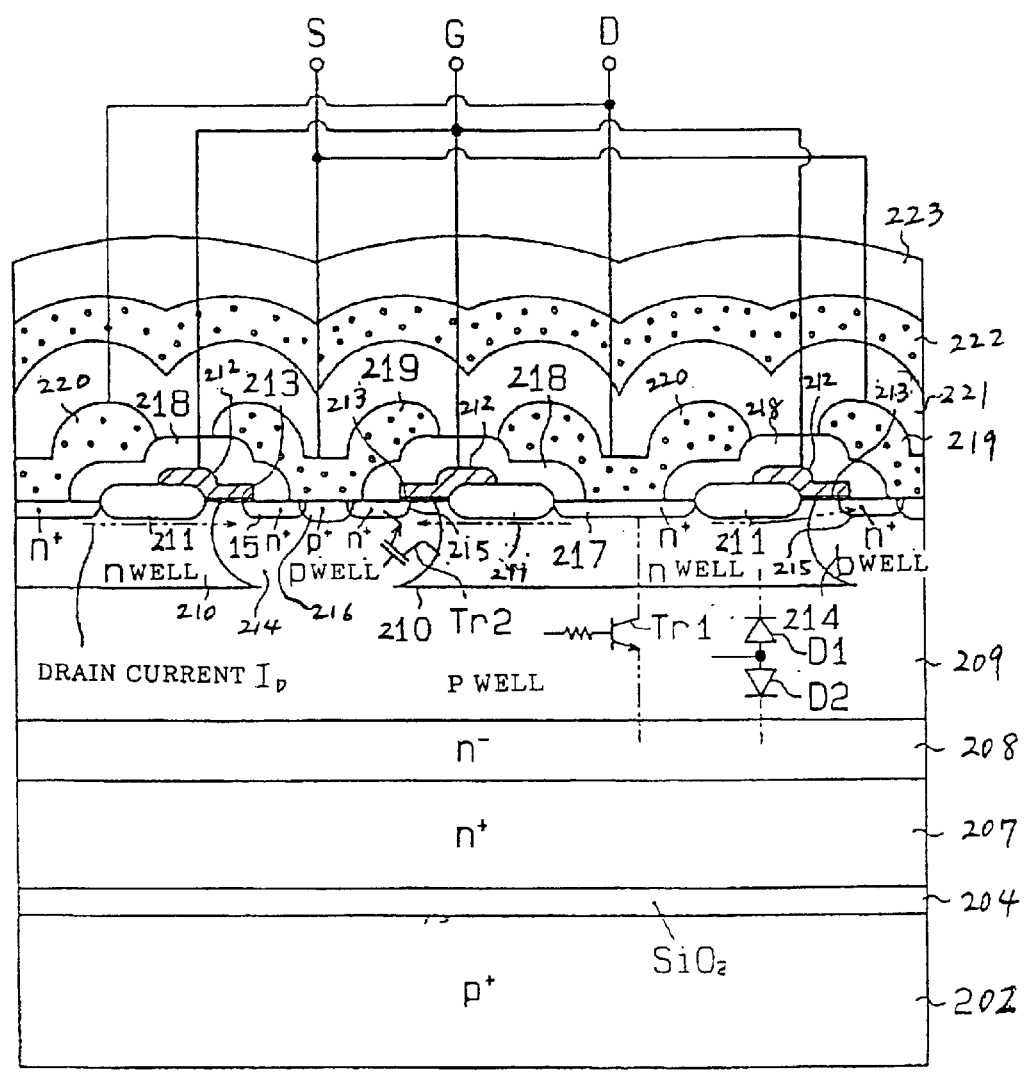
FIG. 16 is an enlarged cross-sectional view showing the FIG. 14 power MOS transistor.

A detailed description thereof will be taken with reference to an enlarged view of FIG. 16. An LOCOS oxide film(s) 211 is generated in a given area(s) of the surface section of the substrate and a poly silicon gate electrode(s) 212 is placed thereon. Formed under the poly silicon gate electrode 212 is a silicon oxide film 213 serving as a gate insulating film. In addition, a channel formation p well region 214 and an n$^+$ source region 215 are generated by double diffusion in a manner that baron (B) and arsenic (As) are dosed through the use of the poly silicon gate electrode 212 as a diffusion window. Moreover, a p$^+$ region 216 is formed in the channel formation p well region 14. Besides, an n$^+$ region 217 is created in a surface layer section of the n well region 210.

In FIG. 16, a BPSG film 218 is located on the LOCOS oxide film 211 and the poly silicon gate electrode 212, and a source electrode 219 are disposed to come into contact with the n$^+$ source region 215 and the p$^+$ region 216, with the source electrode 219 being made of aluminium. Further, a drain electrode 220 is disposed to come into contact with the n$^+$ region 217, with the drain electrode 220 being also made of aluminium.

The source electrode 219 and the drain electrode 220 organize a first aluminium layer. Still further, a second aluminium layer 222 is placed on the first aluminium layer (219, 220) in a state where a TEOS layer 221 is put therebetween. The second aluminium layer 222 is covered with a silicon nitride film 223 acting as a passivation film.

In cases where the transistor is in the ON state due to the application of a gate voltage thereto, a drain current ID flows from the drain terminal to the source terminal under the silicon oxide film 213 being the gate insulating film, as indicated by a two-dot chain line in FIG. 16.

Thus, the area for the formation of the p well region 214 works as a source cell 224 whereas the area for the formation of the n well region 210 serves as a drain cell 225, with the result that a number of source cells 224 and a number of drain cells 225 are disposed vertically and horizontally in an island 206 of the silicon chip 201. For example, the number of cells (the total sum of source cells and drain cells) in the island 206 is set to be approximately 10000 cells. More specifically, in FIG. 14 the source cells 224 and the drain cells 225 have plane structure to produce square configurations and are alternately arranged to make so-called checkers. Further, the area A1 for the formation of the source and drain cells 224, 225 is divided into a first block BL1, a second block BL2, a third block BL3, a fourth block BL4 and a fifth block BL5, each of which has a rectangular configuration. Incidentally, it is also appropriate that each of the source cells 224 and the drain cells 225 has a plane structure to produce a rectangular configuration.

As described above, the p well region (the first conductive well region present at the outside position) 209 and the n well region (the second conductive well region present at the inside position) 210 are formed on the surface layer of the silicon chip (the semiconductor substrate) 201 through the use of the double diffusion, and many source and drain cells 224, 225 are produced on the surface of the silicon chip 201. That is, the n⁻ epitaxial layer (the second conductive semiconductor layer) 208 is formed on the surface layer side of the silicon chip 201, and the p well region (the first conductive well region present at the outside position) 209 and the n well region (the second conductive well region present at the inside position) 210 are formed in the n⁻ epitaxial layer 208 according to the double diffusion technique, and further many source and drain cells 224, 225 are created on the surface of the n⁻ epitaxial layer 208. In FIG. 14, the source and drain cells 224, 225 are simplified and limited in number for a better understanding thereof.

As shown in FIGS. 14 and 15, there are n⁺ diffusion regions (which will be referred hereinafter to as deep n⁺ regions) 226a, 226b, 226c, 226d, 226e, 226f formed to have great diffusion depths and to reach the buried layer 207. These deep n⁺ regions 226a to 226f are disposed to surround the blocked source and drain cell formation areas BL1 to BL5. Further, in the formation of the deep n⁺ regions 226a to 226f the diffusion of phosphorus (P) is deeply made by approximately 7 mm in width and approximately 11 mm in depth in order to reduce the resistance.

Figure 26:
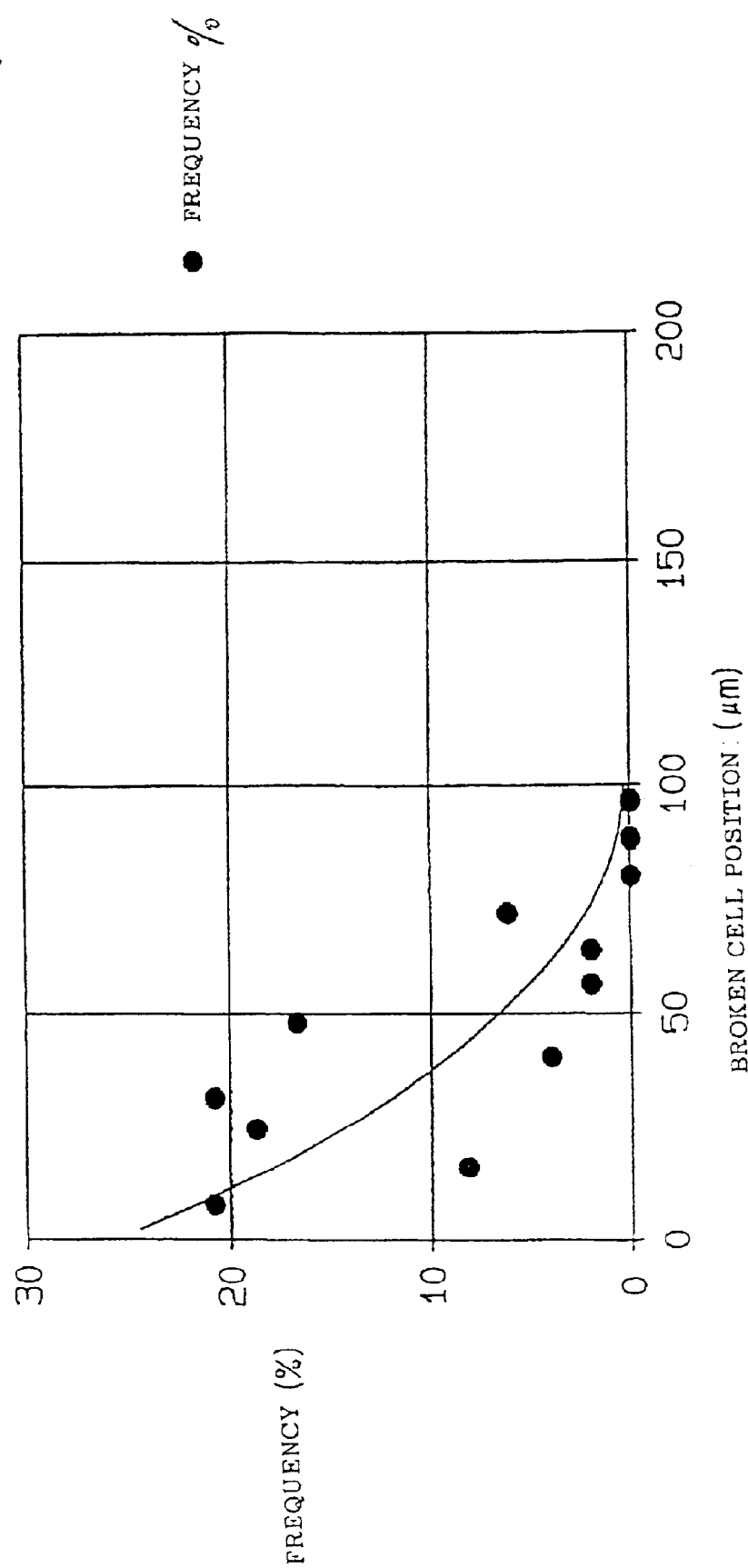
FIG. 26 is an illustration of a distribution of the positions of breakdown cells due to static electricity.

Furthermore, as shown in FIG. 14, the width W of each of the source and drain cell blocks BL1 to BL5, i.e., the width W of each of the source and drain cell formation areas put between the deep n⁺ regions 226a to 226f, is below 200 μm which makes the surge current (which will be described later) easily flow. This is because as shown in FIG. 26 the cells of a power element with a prior structure broken due to the static electricity distribute within the range of at most 100 μm from the boundaries between the source and drain cell formation area and the deep n⁻ region. Briefly describing the illustration of FIG. 26, this figure shows a distribution the positions of the cells broken due to static electricity where the horizontal axis represent the broken cell position while the vertical axis denotes the breakdown frequency. It is found from FIG. 26 that the cells are broken within the range up to 100 μm in cell position but not broken when exceeding 100 μm. That is, if the width W of each of the source and drain cell formation areas is determined to be below 200 μm, the breakdown of the cells is preventable.

In this embodiment, as shown in FIG. 15 there is taken a low side switch structure where a load (for example, an inductance such as a motor) 227 is disposed on the drain side of the LDMOS transistor. In this instance, the deep n⁺ regions 226a to 226f are connected to the source to be used as the ground. That is, the substrate potential is grounded together with the source and the power MOS transistor is placed on the ground side with respect to the load 227 disposed between the high potential Vcc (18V) and the ground.

In the detail of the wiring, as shown in FIG. 16 each drain electrode 220 is electrically connected (wired) and further each source electrode 219 is electrically connected. A via hole is made in the first aluminium layer with respect to the TEOS layer 221 and the second aluminium layer 222 is used in a state with being separated into the source and the drain.

Figure 17:
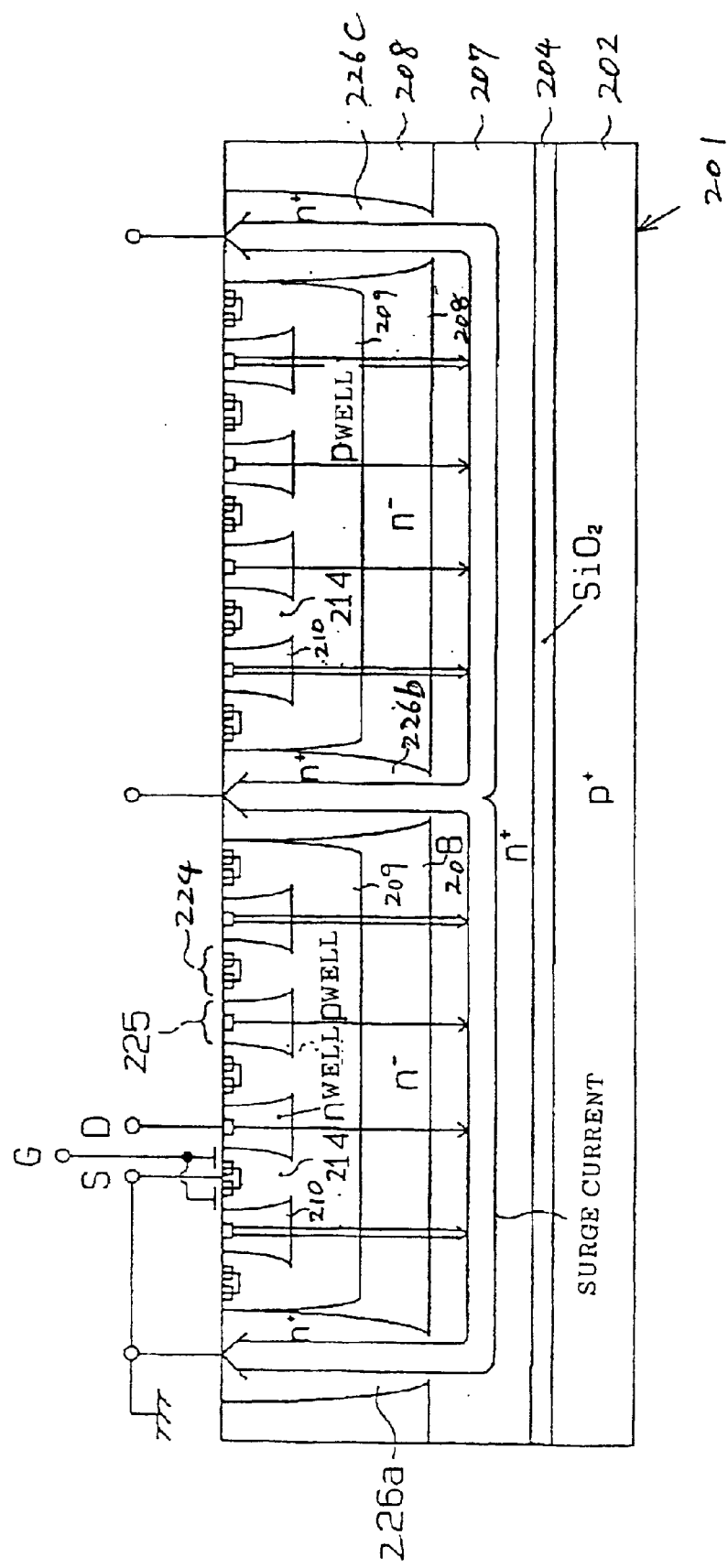
FIG. 17 is a cross-sectional view useful for describing an operation of the power MOS transistor.

Secondly, a description will be taken hereinbelow of an operation of the power MOS transistor (the low side structure) thus constructed. As shown in FIG. 16, in the case of the entry of the surge current from the drain due to the discharge of static electricity, a parasitic npn bipolar transistor Tr1 produced right under the drain breaks. Whereupon, as shown in FIG. 17, the surge current passes through the n⁺ buried layer 207 serving as the emitter of the transistor Tr1 and enters the deep n⁺ regions 226a to 226f diffused from the substrate surface and exits to the ground. At this time, since within the cell formation area A1 the deep n⁺ regions 226a to 226f for the discharge of the surge current are periodically scatteringly disposed at a given interval, the entire chip area can absorb the surge current. Accordingly, a given amount of energy disperses, thereby suppressing the rise of the grating temperature. As a result, the surge withstand can improve.

That is, in the prior structure, the surge current brought from the output terminal drain due to the discharge of static electricity tends to flow through a laterally formed parasitic npn transistor Tr2 toward the source electrode, which causes the permanent break own. On the other hand, according to this embodiment, the surface current flows in the vertical direction within the source and drain cell formation area (power element area) but not flowing in the source region present in the surface, thus protecting the MOS channel section to enhance the withstand against the surge such as static electricity.

Moreover, a description will be taken of the case that the surge comes from terminals other than the drain terminal. In FIG. 16, the p region (209) of the source and the n region (210) of the drain constitute a pn diode D1, and this diode D1 gets into the ON state in the forward direction by the surge appearing from the source so that the surge current flows through this diode D1. Accordingly, the temperature rise resulting from the surge is suppressible and it is safely absorbable. In addition, the gate is connected to a gate drive circuit within the IC circuit equipped with an LDMOS transistor. Since it is not singly connected to a terminal of the IC, there is particularly no need to take the surge into consideration.

Figure 23:
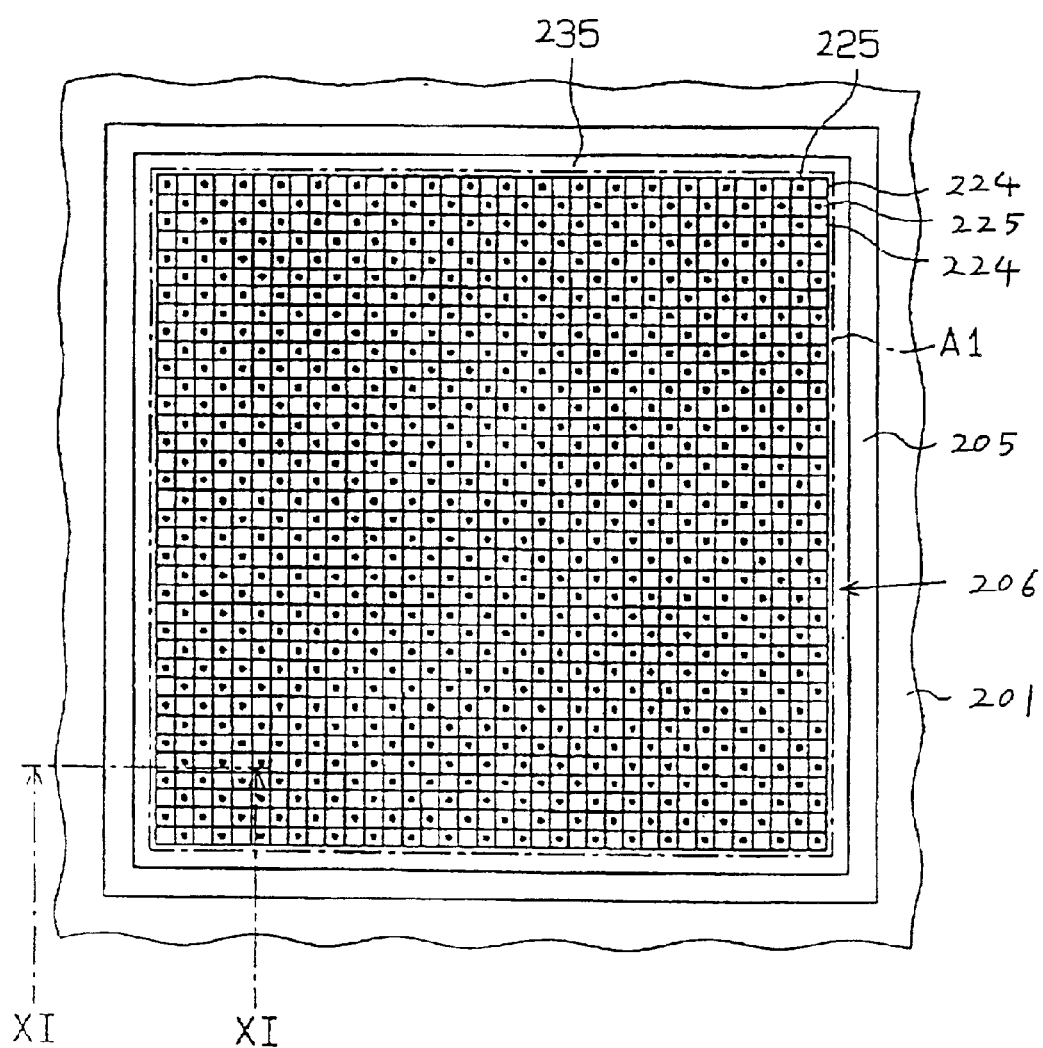
FIG. 23 is a plan view showing a comparative power MOS transistor.
Figure 24:
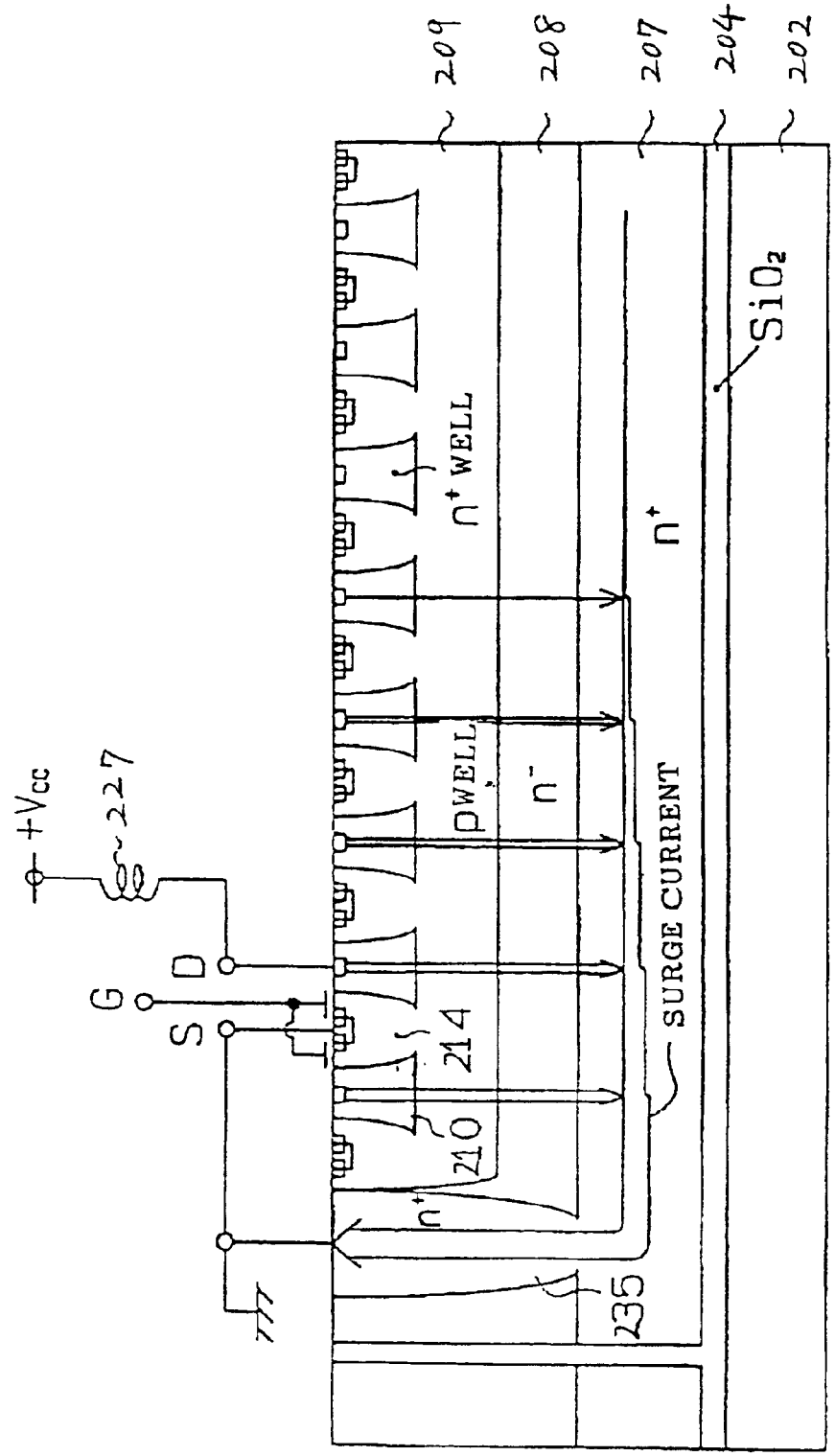
FIG. 24 is a cross-sectional view taken along a line XI—XI of FIG. 23.

The operation and effects thereof will be described hereinbelow in comparison with those of the structure shown in FIGS. 23 and 24. In the case of the structure shown in FIGS. 10, 11, as compared with the prior structure, as shown in FIG. 24, in addition to the formation of the n⁺ buried layer 207, the deep n⁺ region 235 is formed only around the source and drain cell formation area A1 containing 100 cells in the vertical directions and 100 cells in the horizontal directions as shown in FIG. 23. In this case, as shown in FIG. 24, the surge current brought from the output terminal (the drain) due to the discharge of static electricity goes through a vertically formed npn transistor (drain/source/n-type substrate) in the vertical direction of the substrate and further advances to the ground after passing through the deep n⁺ region 235 provided to surround the cell formation area A1. However, since the deep n⁺ region 235 exists only around the power MOS area, the area for discharging the surge current undergoes restriction. For this reason, the surge current focuses on an area close to the deep n⁺ region 235 without being absorbed in the whole island area. In consequence, even in the case of the occurrence of a relatively low surge, the energy concentration increases around the island 206 and the power MOS transistor can be broken due to local heating.

On the other hand, according to this embodiment, there are the deep n⁺ regions 226a to 226f scatteringly formed in the interior of the source and drain cell formation area A1 to reach the n⁺ buried layer 207, and hence the current also disperses to suppress the rise of the grating temperature, thus realizing a power MOS transistor with a high surge withstand.

Figure 18:
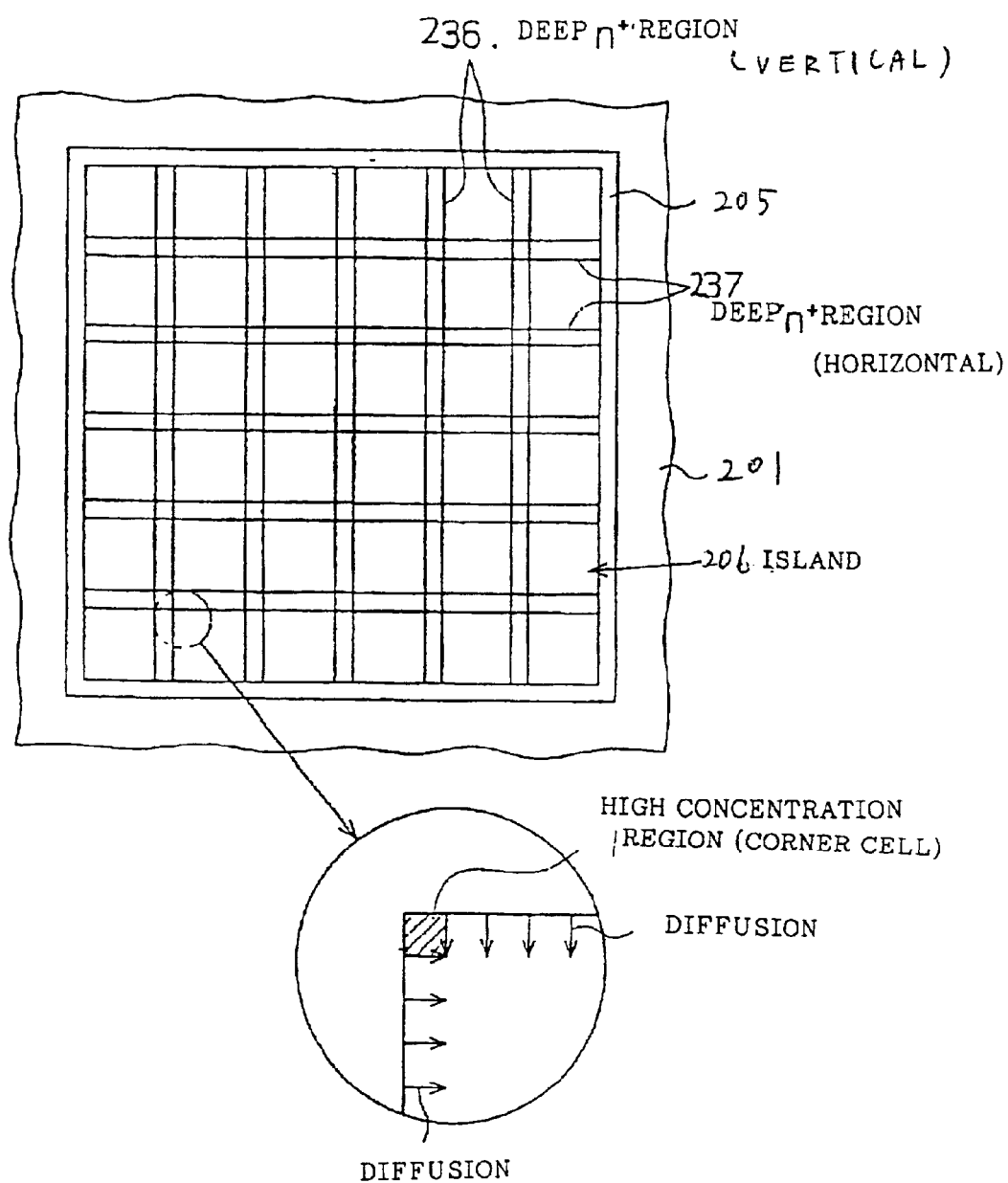
FIG. 18 is a plan view showing a power MOS transistor being a compartive example.

Furthermore, as shown in FIG. 14 the deep n⁺ regions 226a to 226f have a plane structure to define a band (or strip)-like configuration and are arranged to run in parallel to each other at a given interval within the formation area of the source and drain cells 224, 225. In the case shown in FIG. 18 band-like deep n$^+$ regions 236, 237 are formed to extend in both longitudinal and transverse directions within the source and drain cell formation area, the corner portions in the source and drain cell formation area become high-concentration regions due to the longitudinally diffused layer 237 and the electrical resistance of each of the high-concentration regions decreases so that the current tends to easily flow from these portions (the cells present at the corner portions), with the result that the cells a the corner portions are subject to breakdown. The solution of this problem results in difficulty being encountered to form the cells at the corner portions in the source and drain cell formation area which causes the increase in ON resistance. On the other hand, according to this embodiment, since the deep n$^+$ regions 226a to 226f are made to extend in on direction, the corner portions in the source and drain cell formation area do not come into high concentration conditions, so that the formation of the cells at the corner portions are possible and the increase in the On resistance does not occur.

That is, there is no need for the deep n$^+$ regions to extend in both the vertical and horizontal directions, and even if being formed in one direction, the layout of the deep n$^+$ regions is possible with the shortest distance, and further occupying the area of the deep n$^+$ regions is reducible and it is possible to suppress the decrease in the number of cells to the utmost.

Thus, this embodiment provides the features mentioned in (1) to (4).
(1) The n$^+$ buried layer 207 (the second conductive semiconductor buried layer) is formed under the p well region 209 in the silicon chip 201 and the deep n$^+$ regions 226a to 226f (the second conductive deep semiconductor regions) are scatteringly provided in the interior of the source and drain cell formation area A1 to extend from the surface side of the n$^-$ epitaxial layer 208 in the depth direction to reach the n$^+$ buried layer 207 so that the n$^+$ buried layer 207 and the deep n$^+$ regions 226a to 226f define a surge current path. With this structure, as shown in FIG. 17 the surge current coming from the output terminal (drain) flows in the vertical direction through the parasitic transistor Tr1 developed by both the well regions 209, 210 and the n$^-$ epitaxial layer 208 and discharges through the n$^+$ buried layer 207 and the deep n$^+$ regions 226a to 226f. Accordingly, the surge current does not flow in the source region in the surface, thus protecting the MOS channel section and enhancing the withstand against the surge such as static electricity, with the result that a power MOS transistor with a high surge withstand is realizable.

At this time, when the deep n$^+$ regions 226a to 226f are defined as evenly as possible, the surge currents are equalized to disperse the surge energy. That is, the breakdown of the power element depends upon the fact that the surge energy concentrates at a place, and according to this embodiment, it is possible to prevent the concentration of the surge energy, and hence to realize a power MOS transistor with a high surge withstand.
(2) As shown in FIG. 14, the width W of the source and drain cell formation area (block) surrounded by the deep n$^+$ regions 226a to 226f is set to be below 200 mm, which allows the surge current to uniformly flow.
(3) Each of the deep n$^+$ regions 226a to 226f has a plane structure to define a band-like configuration and they are formed to extend in parallel to each other at a constant interval within the source and drain cell formation area A1, and therefore the decrease in the number of cells does not occur as described with reference to FIG. 18, which is desirable.
(4) Since as shown in FIGS. 14 and 15 the islands 206 are defined through the use of the SOI structure and the use of the trench oxide film, as compared with the insulating separation based upon the PN junction, it is possible to prevent the interference between the elements in each island.

Furthermore, a description will be made hereinbelow of a fourth embodiment of the present invention. The description will mainly be taken of the difference from the above-described third embodiment.

Figure 19:
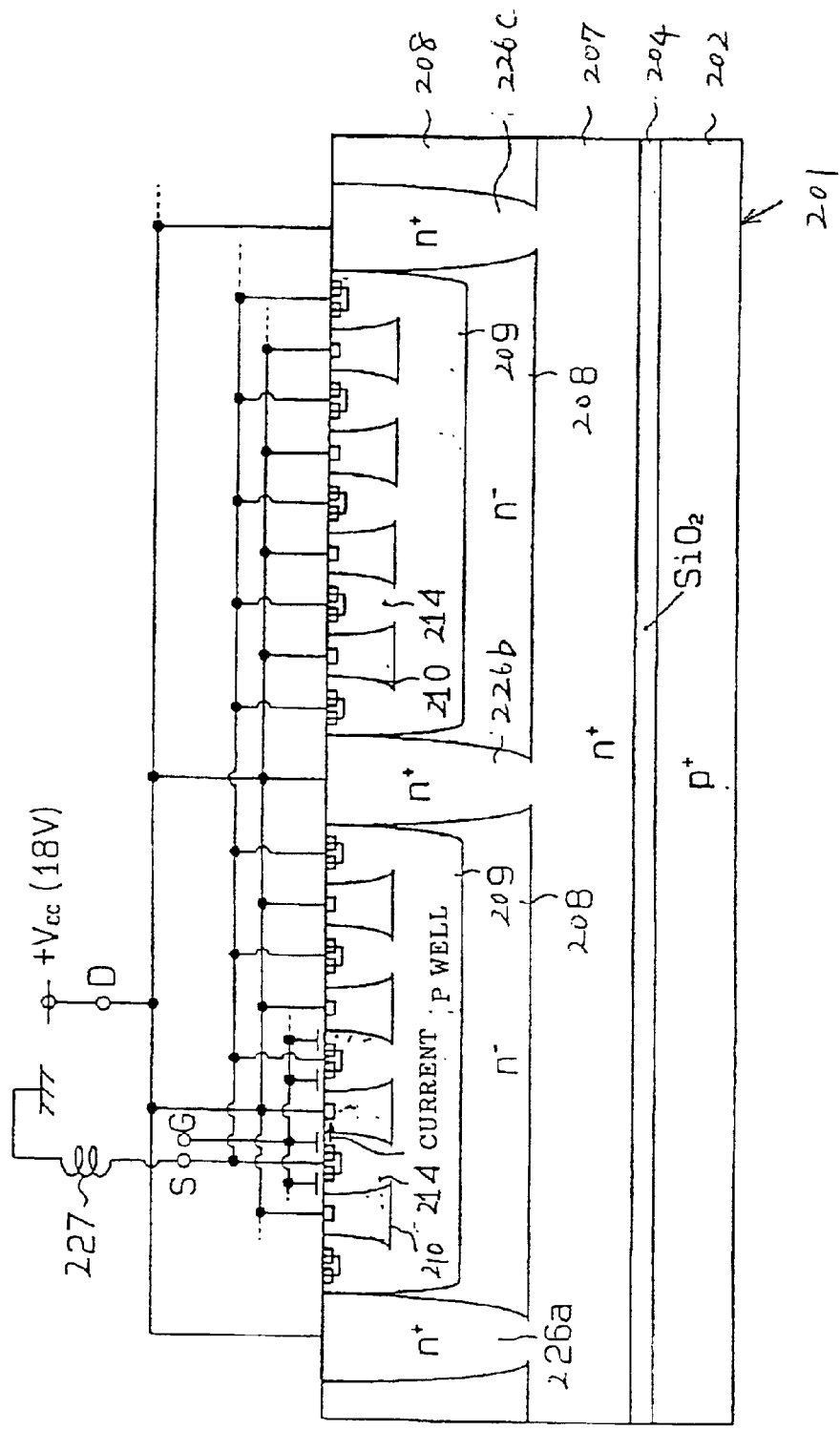
FIG. 19 is a cross-sectional view showing a structure of a power MOS transistor according to a fourth embodiment of the present invention.

Although the above-described third embodiment relates to the low side switch structure, as shown in FIG. 19 this embodiment takes a high side switch structure where the load 227 is connected to the source side. That is, a power MOS transistor is disposed on the power supply side (high potential side) with respect to the load 227 placed between the high potential side Vcc and the ground side. In this case, the deep n$^+$ regions 226a to 226f are connected to the drain side.

Figure 20:
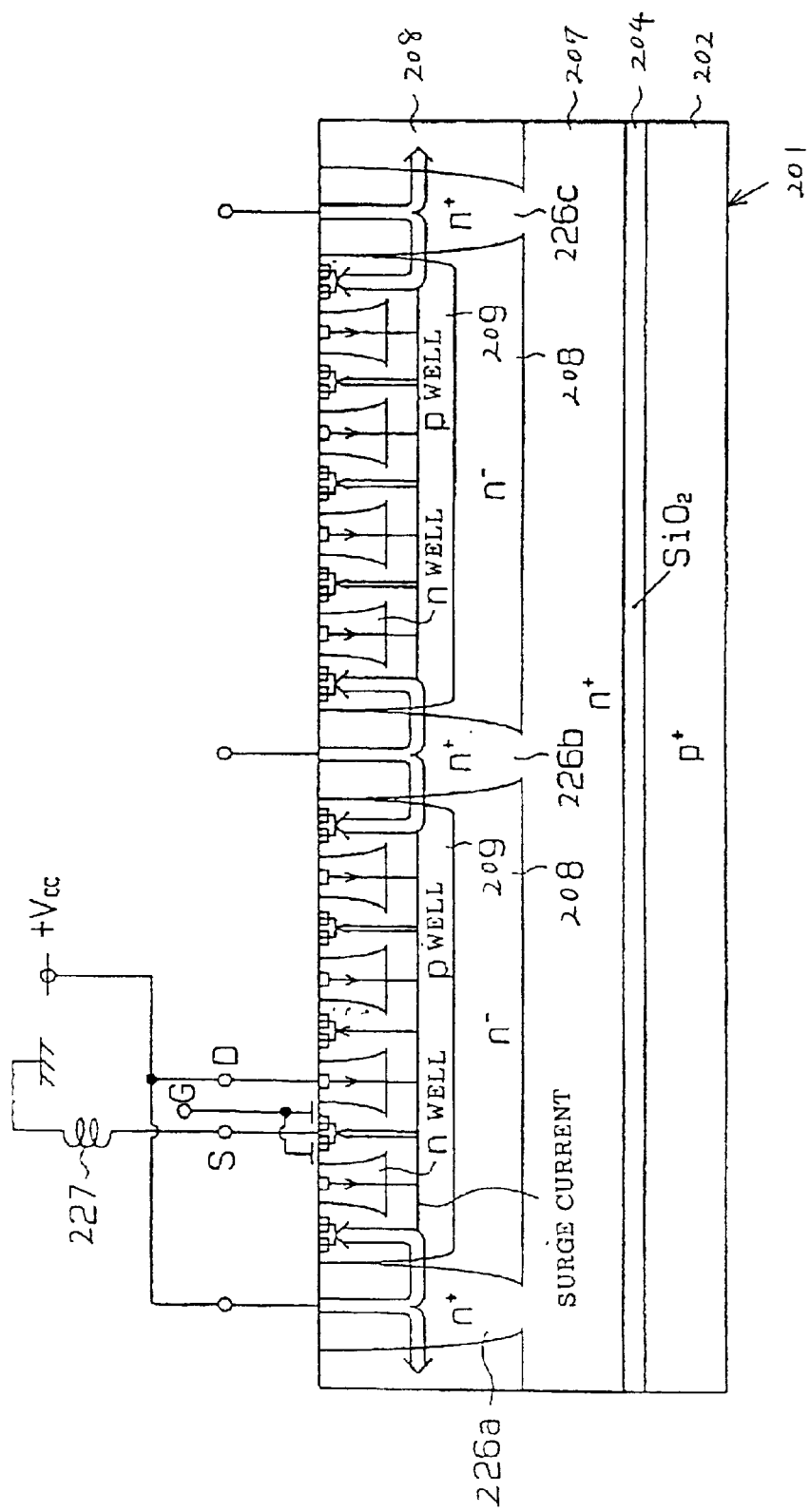
FIG. 20 is a cross-sectional view available for explaining an operation of the FIG. 19 power MOS transistor.

In the high side structure, as shown in FIG. 16, the p well region 209 and the n well region 210 develop the parasitic diode D1. This diode breaks due to the surge current introduced from the drain. Further, as shown in FIG. 20 the surge current can flow from the deep n$^+$ region 226a to 226f periodically and scatteringly existing within the chip in addition to flowing through the diode D1 (dispersedly flowing). That is, since the deep n$^+$ regions 226a to 226f are evenly disposed in the whole chip, the current also dispersedly flows to suppress the rise of the grating temperature, so that the surge withstand can improve. Further, the surge applied from the source also operates the diode produced by the drain or the deep n$^+$ regions 226a to 226f, thus absorbing the surge.

Figure 25:
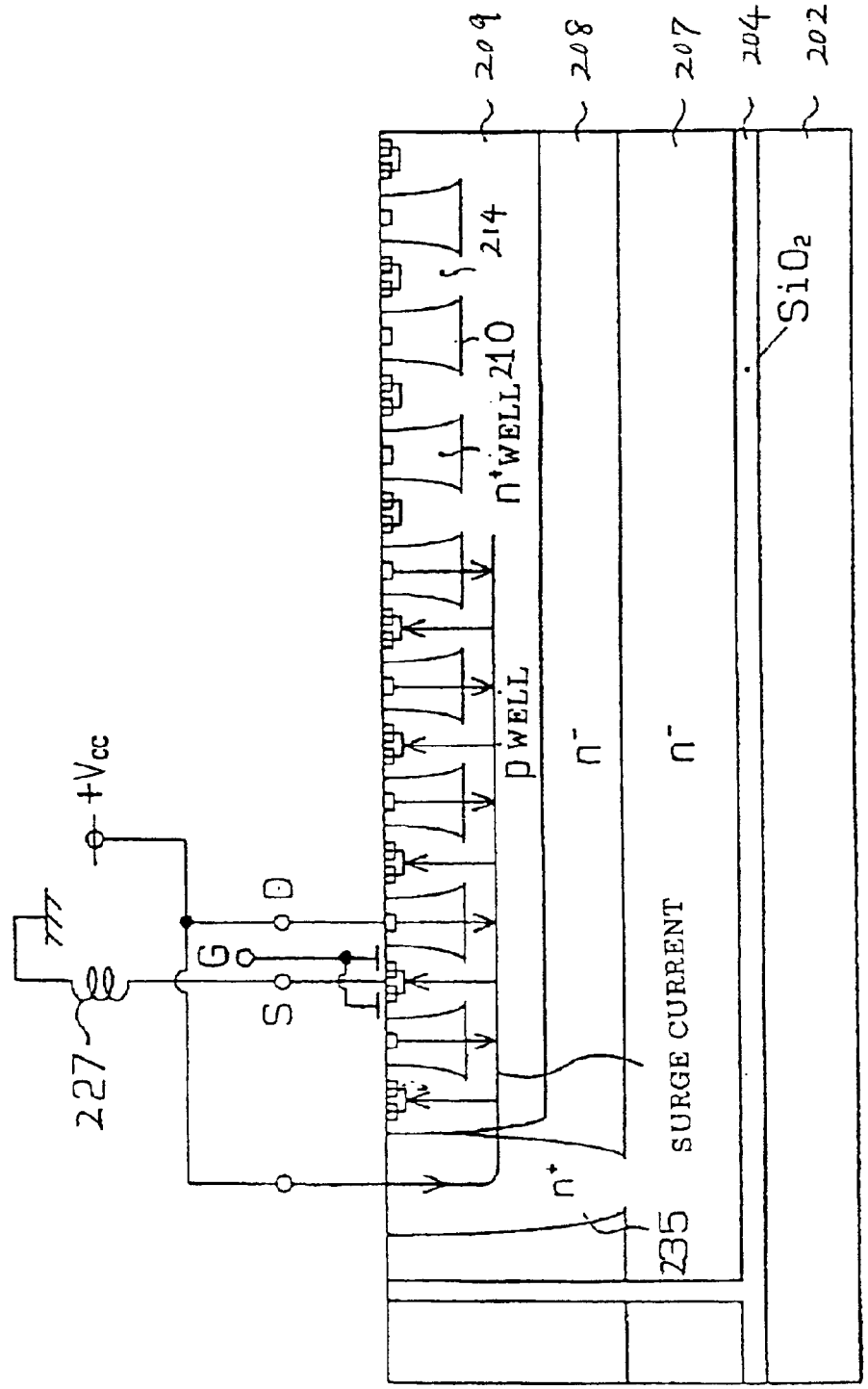
FIG. 25 is a cross-sectional view showing a comparative power MOS transistor.

The description of the operation and effects thereof will be taken hereinbelow in comparison with the structure shown in FIGS. 23 and 25. In the case of employing the structure shown in FIGS. 23 and 25, as shown in FIG. 23 the deep n$^+$ region 235 for the formation of the surge current path is formed only around the source and drain cell formation area A1 and the high side switch structure is made as shown in FIG. 25. In this case, in the high side structure, the current coming from the output terminal (drain) is also branched partially to the substrate side. However, since the deep n$^+$ region 35 exists only around the cell formation area A1, the dispersion of the surge energy is unsatisfactory and the surge withstand is low.

On the other hand, according to this embodiment, the current is also dispersed to suppress the rise of the grating temperature, and therefore it is possible to realize a power MOS transistor with a high surge withstand. Thus, this embodiment can provide the following features. That is, as shown in FIG. 20 the surge current brought from the output terminal (drain) discharges through the scattered deep n$^+$ regions 226a to 226f in addition to the parasitic diode D1 developed by both the well regions 209, 210, with the result that the surge current separately flows without all concentrating at the drain. That is why the surge current does not flow in the source region in the surface to protect the MOS channel section and the withstand against the surge such as static electricity can improve. This allows a power MOS transistor with a high surge withstand to be realizable.

In this case, if the deep n$^+$ regions 226a to 226f are provided within the cell formation area A1 as evenly as possible, the surge current can evenly disperse, thus carrying out the dispersion of the surge energy.

Figure 21:
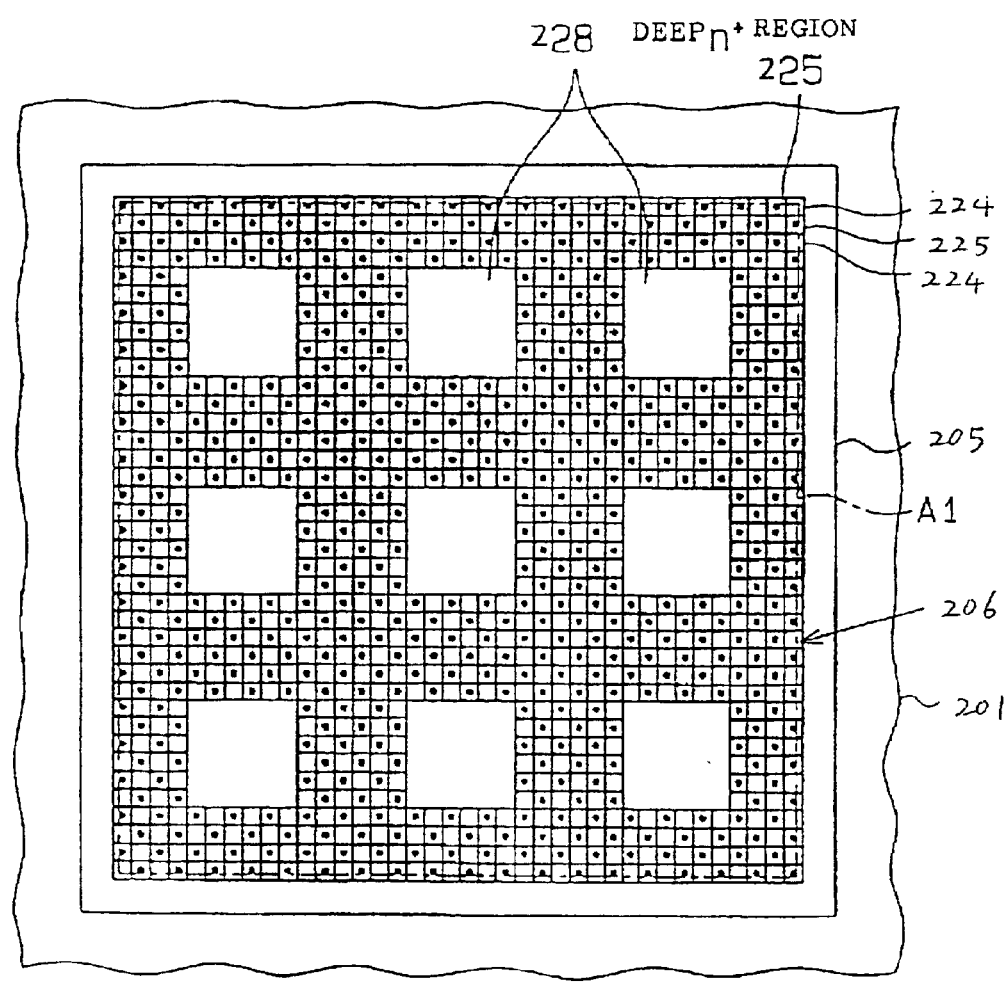
FIG. 21 is a plan view showing a structure of a power MOS transistor according to a fifth embodiment of the present invention.

Still further, a description will be made hereinbelow of a fifth embodiment of the present invention. The description thereof will mainly be taken of the difference from the above-described third embodiment. FIG. 21 is a plan view showing a power MOS transistor (chip 201) according to this embodiment. Within the source and drain cell formation area A1, a number of deep $n^+$ regions 228 are disposed as second conductive deep semiconductor regions in the form of islands. These deep $n^+$ regions 228 also extend from the surface side of the $n^-$ epitaxial layer 208 (low-concentration semiconductor layer) to reach the $n^+$ buried layer 207 (high-concentration semiconductor layer) as shown in FIG. 15.

Moreover, a surge current path is developed by the $n^+$ buried layer 207 and the deep $n^+$ region 228, and the surge discharge area (in the case of the low side switch structure) or the surge absorption area (in the case of the high side switch structure) created by the deep $n^+$ region 228 is scatteringly disposed as evenly as possible within the power element area, so that the surge current is equally divided to accomplish the dispersion of the surge energy. Accordingly, although the breakdown of the power element occurs due to the concentration of the surge energy at a place, according to this embodiment a power element with a high surge withstand is realizable because of no concentration of the surge energy. That is, the protection of the MOS channel section is achieved in a manner that the discharging region for drawing the surge current brought from the output terminal (drain) is scattered in the cell area or the surge absorption area for separating the surge current to make it flow through the source region so as not to all concentrate at the drain, thus enhancing the withstand against the surge such as static electricity.

Besides, a description will be made hereinbelow of a modification of the above-described third to fifth embodiments. That is, it is also appropriate that as shown in FIG. 22, deep $n^+$ regions 231 are scatteringly formed to have an island-like configuration, and the scattered deep $n^+$ regions 231 and cell formation regions similarly scattered are alternately arranged vertically and horizontally.

Figure 22:
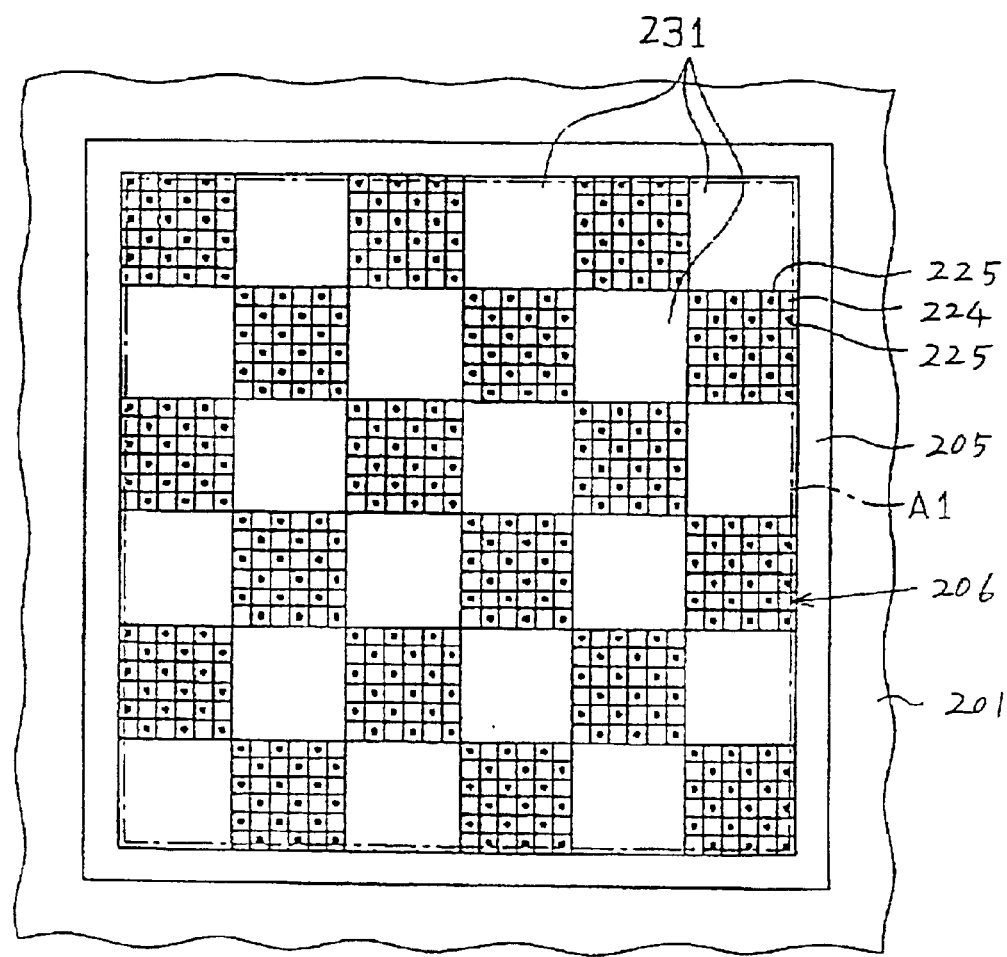
FIG. 22 is a plan view showing a modification of the power MOS transistors.

In comparison between the island-like disposition of the deep $n^+$ regions 228, 231 shown in FIGS. 21 and 22 and the strip-like disposition as shown in FIG. 14, the strip-like disposition can suppress the decrease in the source cells and the drain cells determining the ON resistance and improve the surge withstand without heightening the ON resistance of the LDMOS. In addition, it is advantageous in that the wiring is easy because of having a simple structure.

Furthermore, although in the above description the drain cells and the source cells have a square (or rectangular) configuration, it is also possible that they have an elongated strip-like configuration or a hexagonal configuration. Still further, although in the above description the deep $n^+$ regions are periodically disposed, it is not always required to strictly produce the periodic pattern, and even in the case of the randomly scattering disposition within the LDMOS section, the surge is absorbable. However, in this case, the layout wiring becomes troublesome.

Moreover, although the above-mentioned embodiments include the $n^+$ buried layer 207 and the scattered deep $n^+$ regions, it is also possible to provide only the deep $n^+$ regions (the surge current path is made using only the scattered deep $n^+$ regions). That is, in the case of using with only the high side switch structure, the use of only the deep $n^+$ regions is possible.

Figure 27:
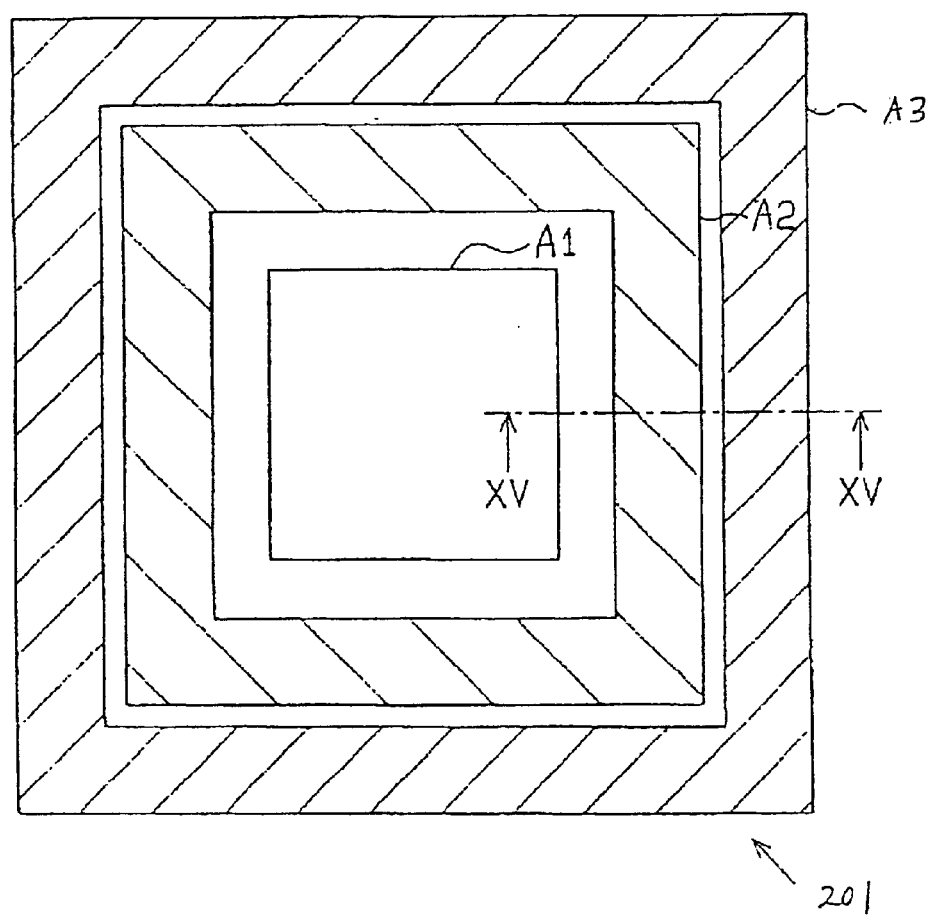
FIG. 27 is a plan view showing a structure of a power MOS transistor according to a sixth embodiment of this invention.
Figure 28:
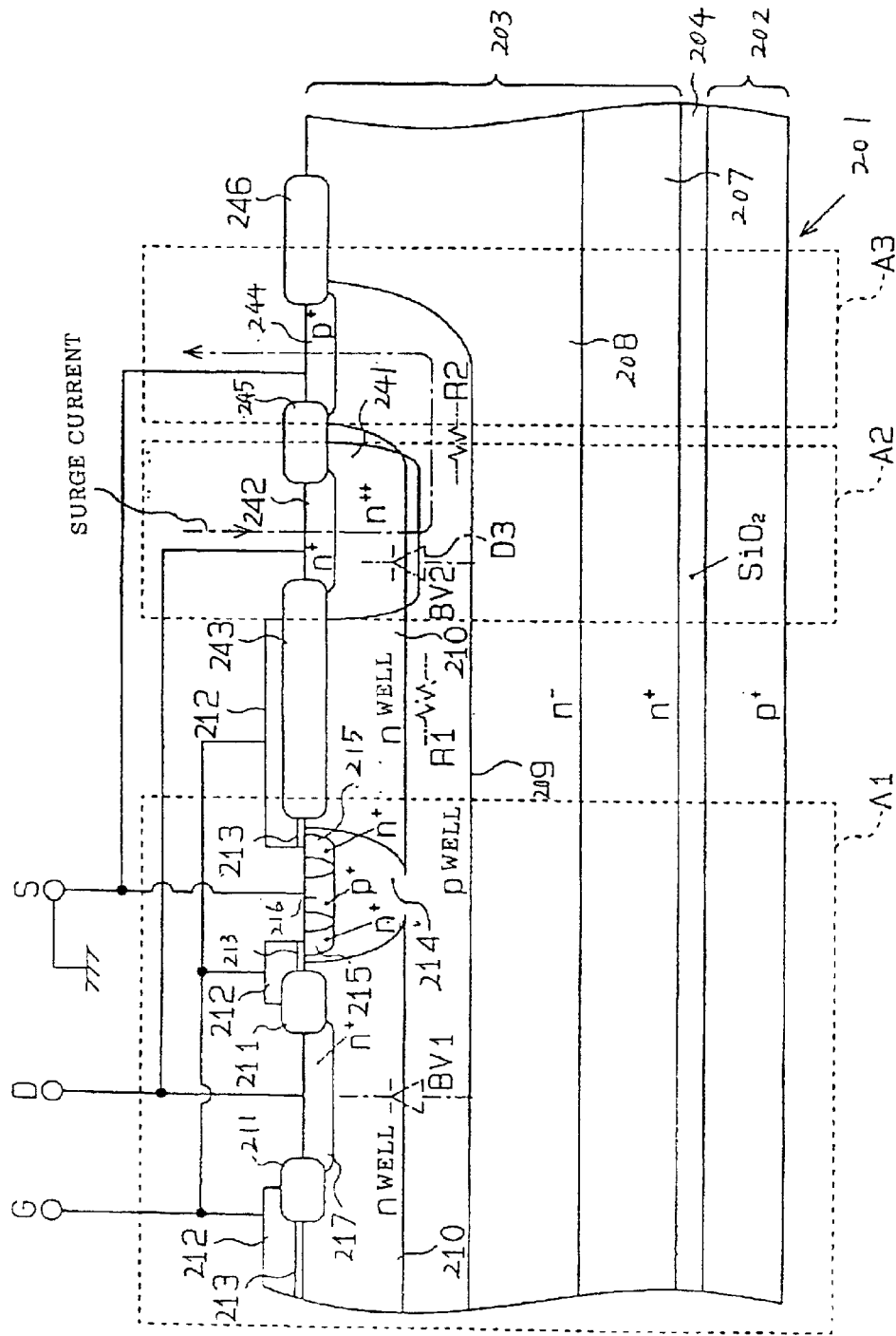
FIG. 28 is a vertical cross-sectional view taken along a line XV—XV of FIG. 27.

Furthermore, a description will be made hereinbelow of a sixth embodiment of the present invention. The description thereof will mainly be taken of the difference from the third embodiment. FIG. 27 is a plan view showing a power MOS transistor according to this embodiment, and FIG. 28 is a longitudinal cross-sectional view taken along a line XV—XV of FIG. 27.

A source and drain cell formation area A1 is defined in a silicon chip 201 serving as a semiconductor substrate and has a square configuration. The source and drain cell formation area A1 has the source cells and drain cells formed as shown in FIG. 16. That is, the substrate assumes the SOI structure and has, at its surface layer section, the p well region 209 and n well region 210 generated by the double diffusion. Further, an LOCOS oxide film 211 is formed in a given region on the surface section of this substrate, and a poly silicon gate electrode 212 is placed thereon in a state where a silicon oxide film 213 acting as a gate insulating film is interposed therebetween. Still further, the substrate surface section has a p well region 214, $n^+$ source region 215, $p^+$ region 216 and $n^+$ region 217 formed thereon. The BPSG film 218, the source electrode 219, the drain electrode 220, the TEOS layer 221, the second aluminium layer 222, the silicon nitride film 223 (passivation film) and others in FIG. 16 are omitted for convenience in description.

In the silicon chip 201 a ring-like surge absorption area A2 is adjacently formed around the source and drain cell formation area A1. The surge absorption area A2 is an area for receiving the surge current coming from the drain. The end portion of the n well region 210 is extended into the surge absorption area A2, and formed in its surface section is an $n^{++}$ region 241 which is a second conductive impurity diffusion region and further formed extendedly within the $n^{++}$ region 241 is a contact $n^+$ region 242. The surface section of the $n^+$ region 242 is connected as the surge current absorption section to the drain terminal through aluminium wiring (not shown) as shown in FIG. 28. In addition, the source and drain cell formation area A1 and the surge absorption area A2 are separated by an LOCOS oxide film (field oxide film) 243.

In this case, the diffusion depth of the $n^{++}$ region 241 is made to be greater than the depth of the $n^+$ region 217 in the drain cell, and its break voltage BV2 is made to be lower than the element breakdown voltage BV1. That is, a parasitic diode D3 developed by the $n^{++}$ region 241, the n well region 210 and the p well region 209 comes into breakdown with the voltage BV2 lower than the element breakdown voltage BV1, and the drain breakdown voltage depends upon the voltage BV2 of the surge absorption area A2 but not relying on the element breakdown voltage BV1.

Moreover, in the silicon chip 201 a ring-like surge draw area A3 is adjacently formed around the surge absorption area A2. The surge draw area A3 is for the purpose of drawing the surge current flowing out from the surge absorption area A2.

The end portion of the p well region 209 is extended into the surge draw area A3 and a contact $p^+$ region 244 is formed in its surface layer section. The surface section of the $p^+$ region 244 is connected as a surge current draw section to the source terminal through aluminium wiring (not shown), with the source terminal being fixed to the ground potential. Further, the surge absorption area A2 and the surge draw area A3 are separated by an LOCOS oxide film (field oxide film) 245, and an LOCOS oxide film 246 is formed around the surge draw area A3.

In this case, in the relationship between the LOCOS oxide film 243 and the LOCOS oxide film 245, as shown in FIG.

28 the LOCOS oxide film 243 is made to be longer than the LOCOS oxide film 245, and as compared with a resistance R1 between the source and drain cells (the formation area A1 therefor) and the surge absorption area A2, a resistance R2 between the surge absorption area A2 and the surge draw area A3 is lower. That is, the relationship between the resistance R1 from the surge absorption area A2 to the source and drain cells (the formation area A1 therefor) and the resistance R2 from the surge absorption area A2 to the surge draw area A3 assumes R1>R2. In addition, in terms of the relationship between R1 and R2, it is desirable that R2 is set to be as low as possible.

In this embodiment, the n well region 210 is set to be 1.2 ¥ $10^{15}$ cm$^{-3}$ in surface carrier concentration and approximately 1.5 mm in depth, whereas the n$^{++}$ region 241 is set to be 6 ¥ $10^{19}$ cm$^{-3}$ in surface carrier concentration and approximately 2 mm in depth. Further, the n$^+$ regions 242, 217 have a surface carrier concentration of 1.2 ¥ $10^{18}$ cm$^3$ and a depth of approximately 0.5 mm. In this case, it is preferable that the depth of the n$^{++}$ region 241 is larger than that of the n well region 210 as described in this embodiment or is equal thereto.

Secondly, a description will be taken hereinbelow of an operation of the power MOS transistor thus constructed. The surge current coming from the output terminal (drain) laterally flows through a parasitic diode D3 produced by the n$^+$ region 242 and n$^{++}$ region 241 of the surge absorption area A2 and both the well regions 210, 209, and passes through the p well region 209 to discharge through the p$^+$ region 244 toward the source terminal side. This means that the surge current does not flow in the source regions existing in the surfaces of the source and drain cells. That is, since the resistance R2 between the surge absorption area A2 and the surge draw area A3 is set to be lower than the resistance R1 between the source and drain cell formation area A1 and the surge absorption area A2, it is possible to prevent the surge current from flowing from the surge absorption area A2 to the source and drain formation area A1.

Moreover, since the diffusion depth of the n$^{++}$ region 241 is set to be larger than the depth of the n$^+$ region 217 in the drain cell and its break voltage BV2 is set to be lower than the element breakdown voltage BV1, with the voltage BV2 lower than the element breakdown voltage BV1 the surge current is discharged through the p well region 209 toward the source terminal side.

In this instance, in a manner that the ring-like surge absorption area A2 is disposed around the square source and drain formation area A1 and further the ring-like surge draw area A3 is located around the surge absorption area A2, the surge countermeasure areas A2, A3 are formed to be uniform and have large areas with respect to the source and drain cell formation area A1, with the result that the surge current does not locally concentrate but can evenly flow in a large energy.

Figure 29:
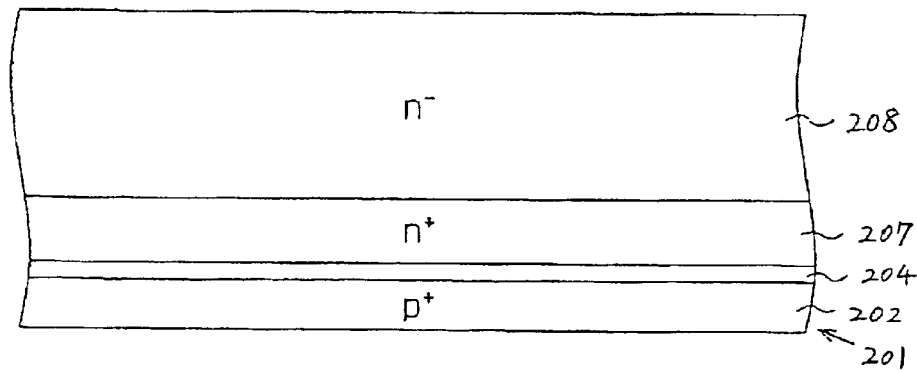
FIG. 29 is a cross-sectional view useful for describing a manufacturing process of the power MOS transistor.
Figure 30:
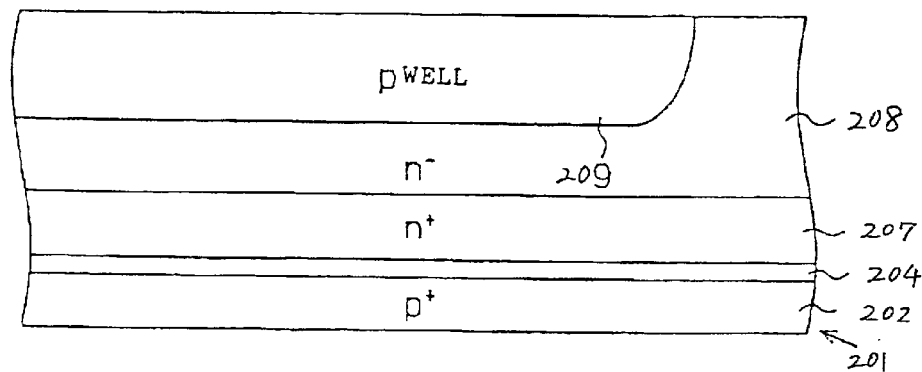
FIG. 30 is a cross-sectional view useful for describing a manufacturing process of the power MOS transistor.
Figure 31:
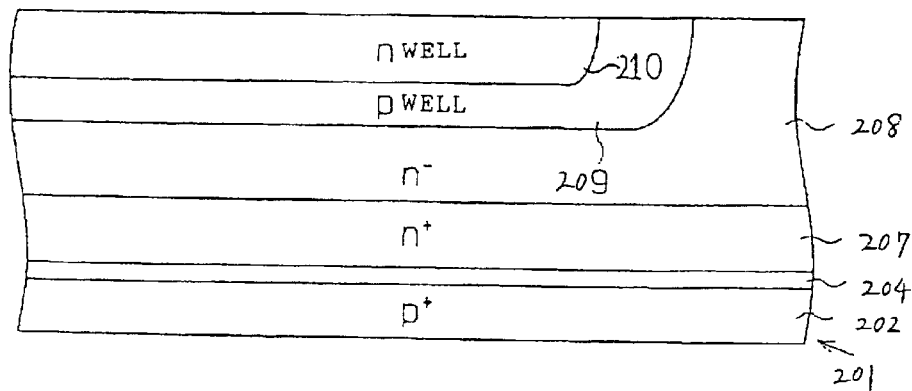
FIG. 31 is a cross-sectional view useful for describing a manufacturing process of the power MOS transistor.
Figure 32:
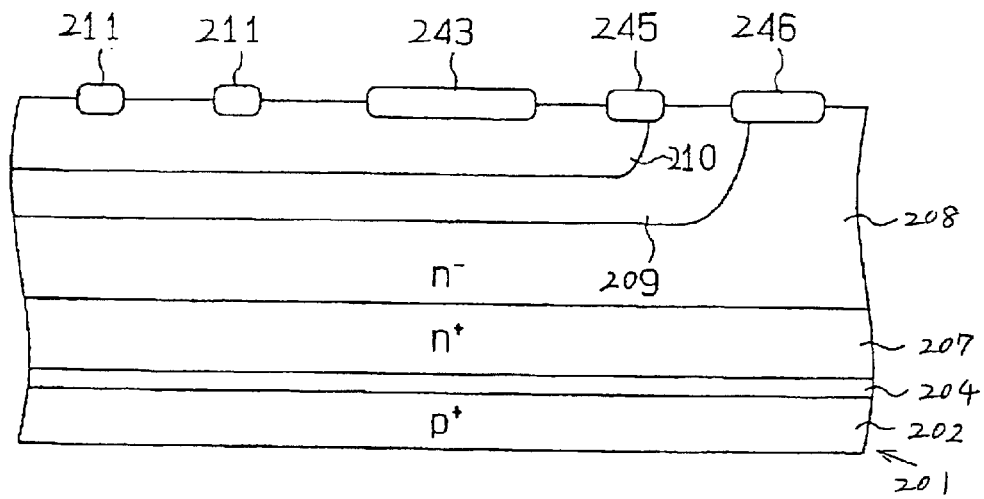
FIG. 32 is a cross-sectional view useful for describing a manufacturing process of the power MOS transistor.
Figure 33:
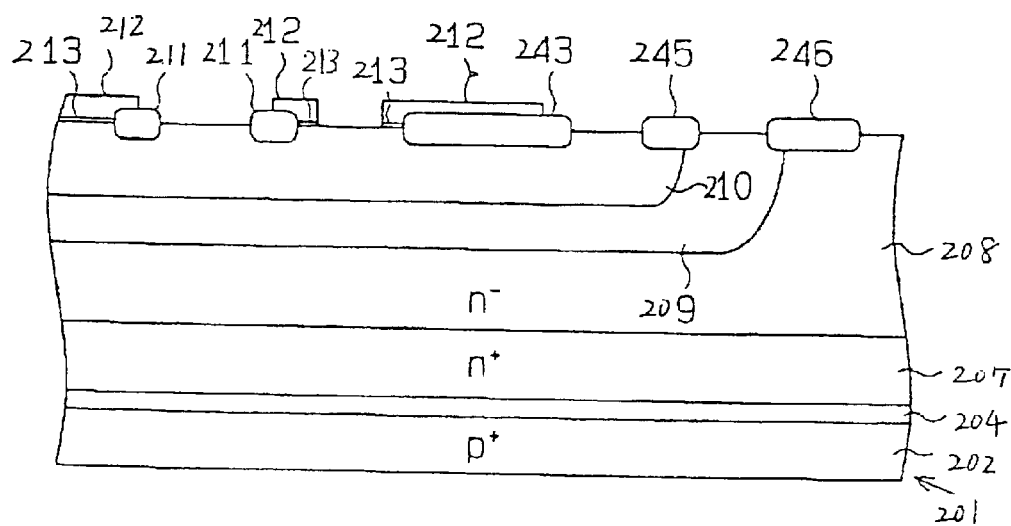
FIG. 33 is a cross-sectional view useful for describing a manufacturing process of the power MOS transistor.
Figure 34:
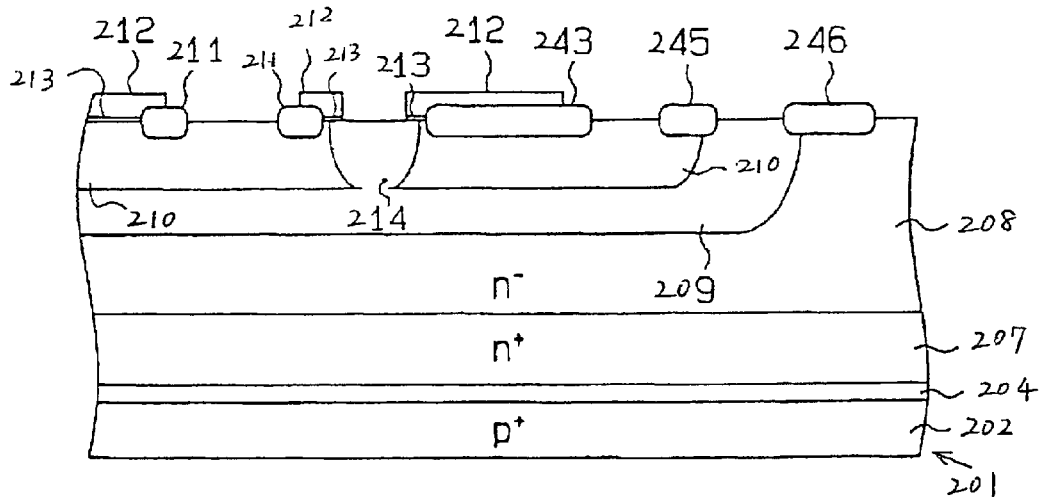
FIG. 34 is a cross-sectional view useful for describing a manufacturing process of the power MOS transistor.
Figure 35:
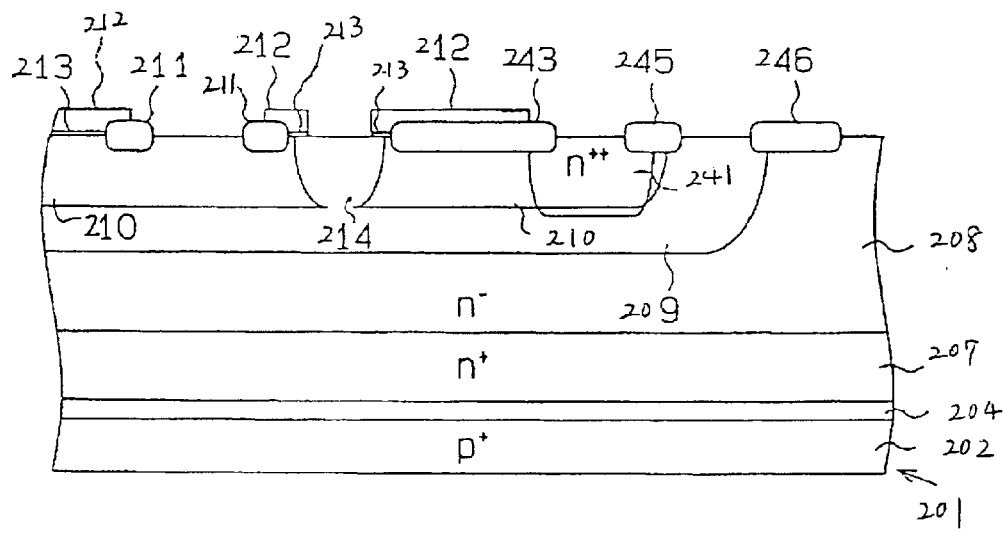
FIG. 35 is a cross-sectional view useful for describing a manufacturing process of the power MOS transistor.

Furthermore, a description will be made hereinbelow of manufacturing processes of this power MOS transistor with reference to FIGS. 29 to 35. Fist of all, as shown in FIG. 29, a laminated substrate is prepared which is produced by placing the silicon oxide film 204, the n$^+$ buried layer 207 and the n$^-$ epitaxial layer 208 in order and in piles on the p$^+$ silicon substrate 202. Subsequently, as shown in FIG. 30 the p well region 209 is formed in the n$^-$ epitaxial layer 208 by the ion implantation, and further as shown in FIG. 31 the n well region 210 is formed in the p well region 209 by the ion implantation. Following this, as shown in FIG. 32 the LOCOS oxide films 211, 243, 245 and 246 are placed at given regions on the surface of the substrate 201, and as shown in FIG. 33 the silicon oxide film (gate insulating film) 213 is placed and the poly silicon gate electrode 212 is further located on the silicon oxide film 213. Moreover, as shown in FIG. 34 the p well region 214 is generated by the ion implantation to penetrate the n well region 210 and then reach the p well region 209. Thereafter, as shown in FIG. 35 the n$^{++}$ region 241 is formed by the ion implantation. Further, as shown in FIG. 28, after the formation of the p$^+$ regions 216, 244, the n$^+$ source regions 215, the n$^+$ region 217 and the n$^+$ region 242 are formed simultaneously.

This embodiment provides the following features.

(1) In the silicon chip 201 (semiconductor substrate), the surface section of the n well region 210 (second conductive well region) at the portion adjacent to the source and drain cells is connected as the surge current absorption section to the drain terminal, and the surface section of the p well region 209 (first conductive well region) at the portion adjacent to this surge current absorption section is connected as the surge current draw section to the source terminal, and even the resistance R2 between the surge current absorption section and the surge current draw section is set to be lower than the resistance R1 between the source and drain cells and the surge current absorption section. Accordingly, as shown in FIG. 28 the surge current coming from the output terminal (drain) laterally flows through the parasitic diode D3 generated by both the well regions 210, 209 and discharges through the p well region 209 (surge current draw section) to the source terminal side. This signifies that the surge current does not flow in the source region existing in the surface of the source and drain cells, thus protecting the MOS channel section to enhance the withstand against the surge like static electricity. In consequence, a power MOS transistor with a high surge withstand is realizable.

(2) In the surge current absorption section of the n well region 210 (second conductive well region), the n$^{++}$ region 241 (second conductive impurity diffusion region) is made which has an impurity concentration higher than that of the n well region 210 and has a depth greater than that of the n$^+$ region 217 (second conductive impurity diffusion region) in the drain cell, thereby attaining the break voltage BV2 lower than the element breakdown voltage BV1. Thus, the surge current can discharge through the p well region 209 (surge current draw section) to the source terminal side with the voltage BV2 lower than the element breakdown voltage BV1.

Although this embodiment is most preferable, it is also possible to adopt a modification in which there is no presence of the n$^{++}$ region 241. In addition, although it is desirable that the break voltage BV2 of the surge absorption area A2 is set to be lower than the element breakdown voltage BV1 of the source and drain cell formation area A1, it is also appropriate that the break voltage BV2 and the element breakdown voltage BV1 is equal to each other. Also in this instance, the improvement of the withstand is possible as long as R1>R2.

Figure 36:
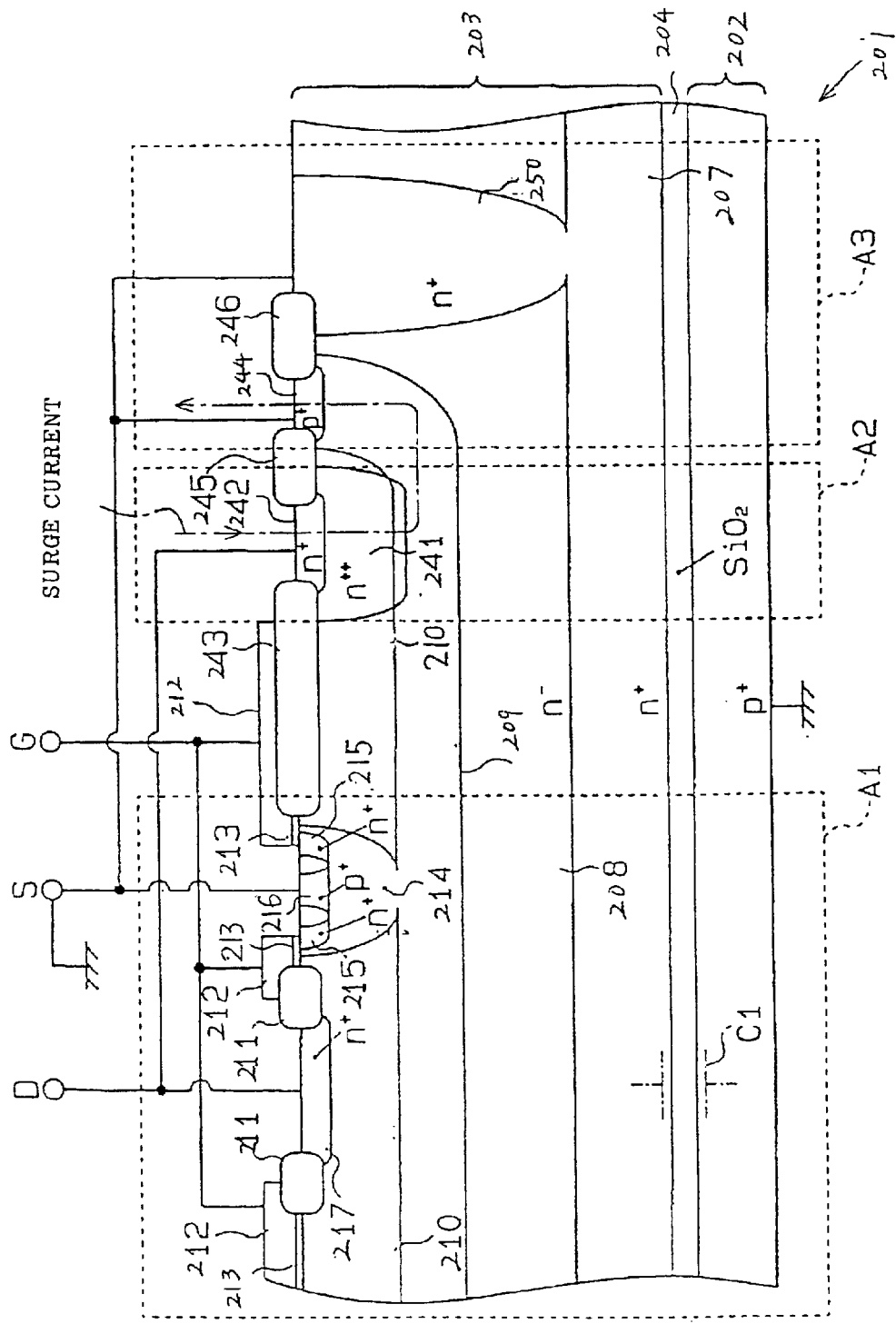
FIG. 36 is a cross-sectional view showing a structure of a power MOS transistor according to a seventh embodiment of this invention.

Moreover, a description will be made hereinbelow of a seventh embodiment of the present invention, but the description will chiefly be taken of the difference from the above-described sixth embodiment. FIG. 36 is a longitudinal cross-sectional view showing a power MOS transistor according to this embodiment, substituting for FIG. 28 (the longitudinal cross-sectional view taken along a line XV—XV of FIG. 27). In the silicon chip 201, a ring-like surge absorption area A2 is formed around a source and drain cell formation area A1, whereas a surge draw area A3 is formed around the surge absorption area A2. In addition, in this embodiment, a deep n$^+$ region 250 serving as a second conductive deep semiconductor region is made at an outer circumference of an LOCOS oxide film 246 in the surge draw region A3. The deep n+ region 250 penetrates an n− epitaxial layer 208 and then reaches an n+ buried layer 207.

The power MOS transistor according to this embodiment has the low side switch structure as well as the case as shown in FIG. 15, where the deep n+ region 250 is connected through aluminium wiring (not shown) to the source terminal (ground) for fixing the substrate potential. More specifically, the n+ buried layer 207, extending under the source and drain cells, is coupled through the deep n+ region 250 to the source terminal (ground). Moreover, a number of semiconductor elements including the power MOS transistor shown in FIG. 36 are formed in a plurality of islands produced through the SOI structure and the separation structure based upon the trench oxide film.

Although, in the silicon oxide film (buried oxide film) 204 placed between the p+ silicon substrate 202 and the n-type silicon substrate 203, a parasitic capacitor C1 exists as shown in FIG. 36, due to the fixing of the potentials of the n+ buried layer 207 and the deep n+ region 250 the variation of the potential of the p+ silicon substrate 202 is suppressible even if the DMOS transistor gets into the switching operation. That is, in the case that the switching noises are not introduced into the p+ silicon substrate 202 and the element separation is made through the use of an insulating film, the switching noises does not propagate to other element regions, thus preventing the malfunction of the other semiconductor elements.

In the case of the high side switch structure as shown in FIG. 19, the deep n+ region 250 in FIG. 36 may be connected to the drain terminal (the power supply terminal) for the fixing of the substrate potential.

Figure 37:
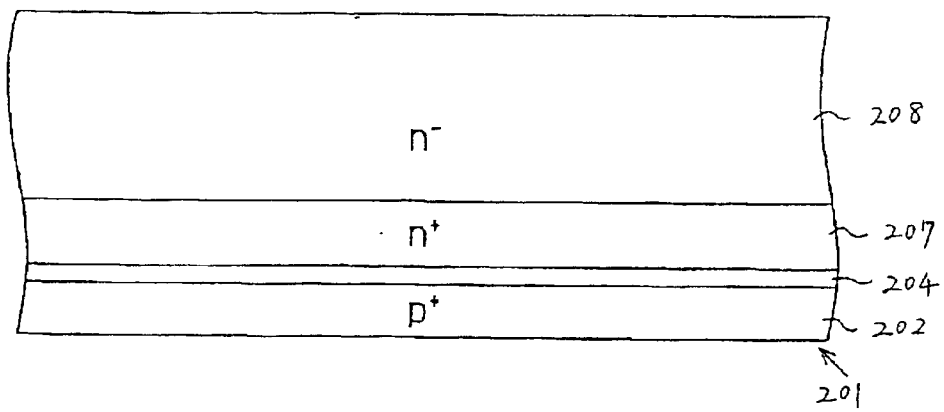
FIG. 37 is a cross-sectional view useful for explaining a manufacturing process of the power MOS transistor.
Figure 38:
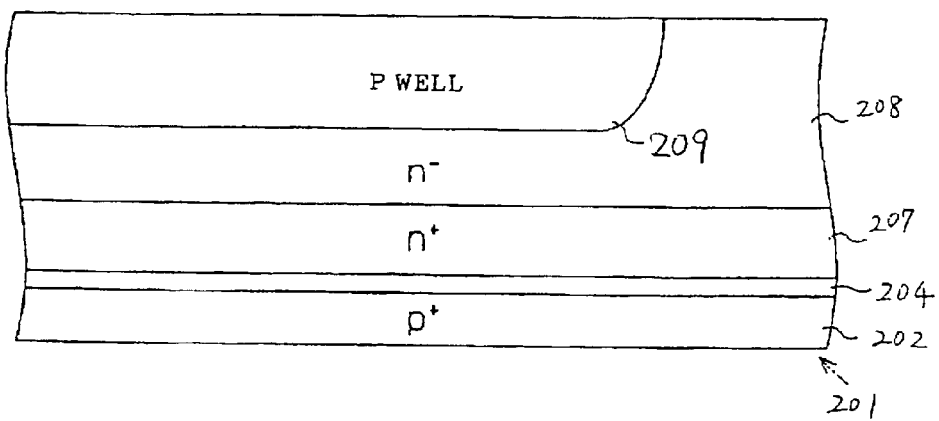
FIG. 38 is a cross-sectional view useful for explaining a manufacturing process of the power MOS transistor.
Figure 39:
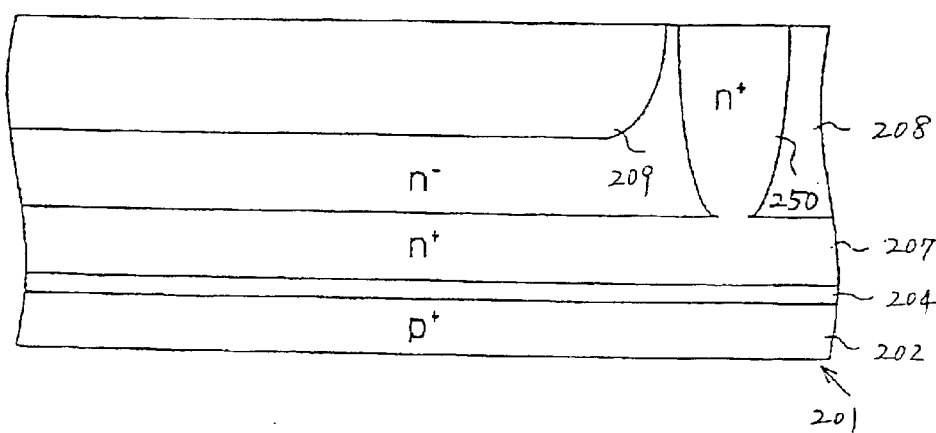
FIG. 39 is a cross-sectional view useful for explaining a manufacturing process of the power MOS transistor.
Figure 40:
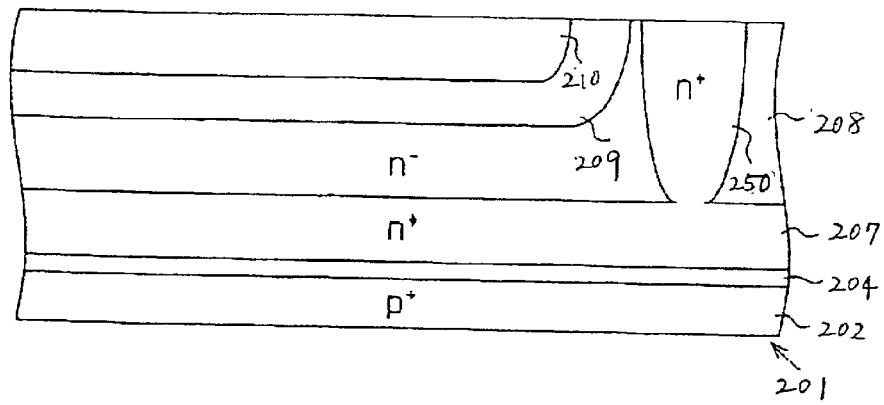
FIG. 40 is a cross-sectional view useful for explaining a manufacturing process of the power MOS transistor.

The power MOS transistor with this structure is manufactured in accordance with the manufacturing processes shown in FIGS. 37 to 44. That is, as shown in FIG. 37 a laminated substrate is prepared which is constructed by piling the silicon oxide film 204, the n+ buried layer 207 and the n− epitaxial layer 208 in order on the p+ silicon substrate 202. Further, as shown in FIG. 38 the p well region 209 is made in the n− epitaxial layer 208 by the ion implantation, and as shown in FIG. 39 the deep n+ region 250 is further made thereby by the ion implantation, and as shown in FIG. 40 the n well region 210 is formed in the p well region 209 by the ion implantation.

Figure 41:
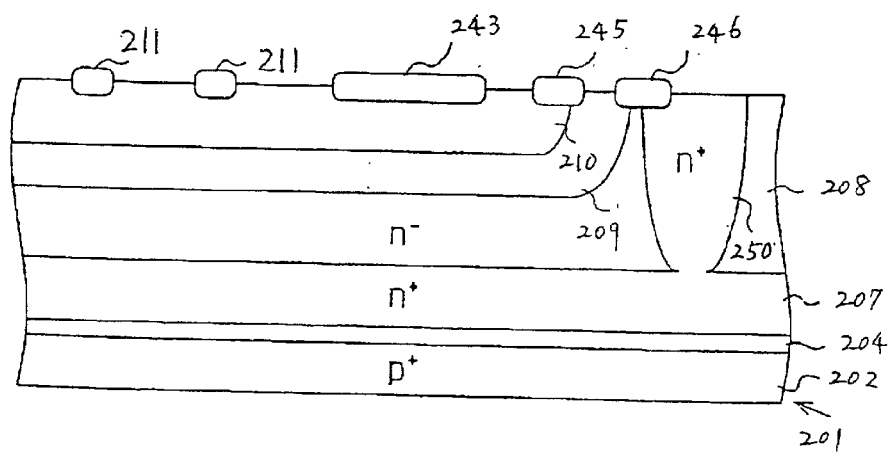
FIG. 41 is a cross-sectional view useful for explaining a manufacturing process of the power MOS transistor.
Figure 42:
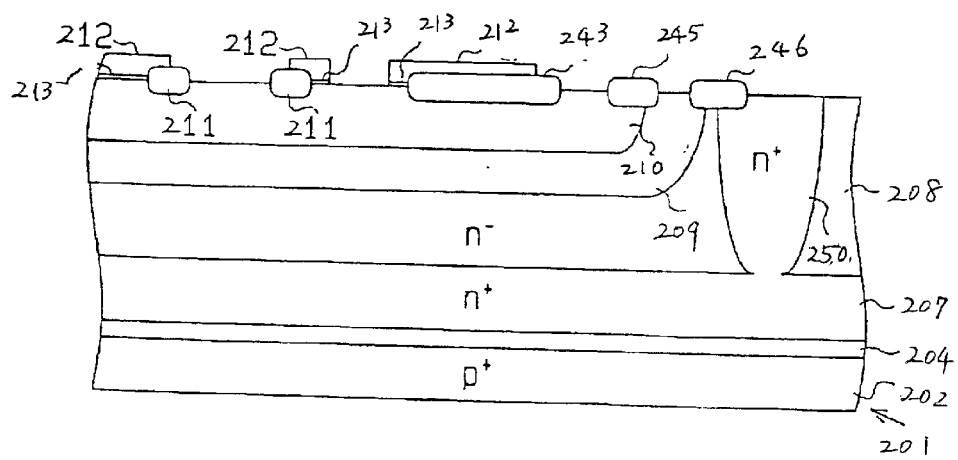
FIG. 42 is a cross-sectional view useful for explaining a manufacturing process of the power MOS transistor.
Figure 43:
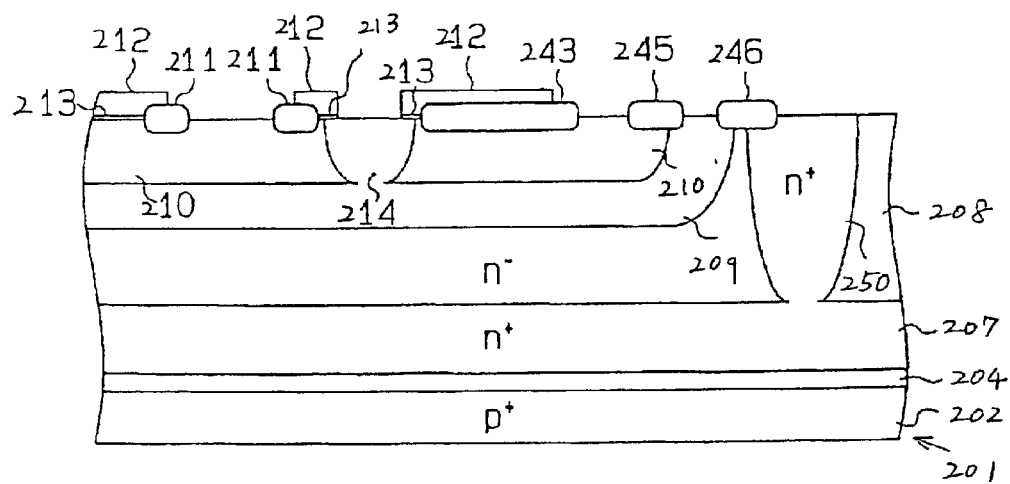
FIG. 43 is a cross-sectional view useful for explaining a manufacturing process of the power MOS transistor.
Figure 44:
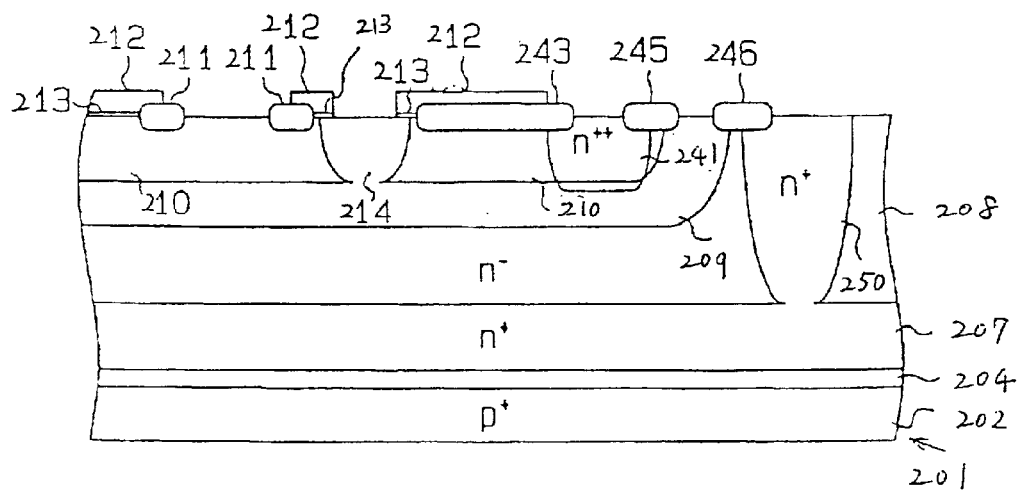
FIG. 44 is a cross-sectional view useful for explaining a manufacturing process of the power MOS transistor.

Subsequently, as shown in FIG. 41 the LOCOS oxide films 211, 243, 245, 246 are formed at given regions on the surface of the substrate 201. Further, as shown in FIG. 42 the silicon oxide film (gate insulating film) 213 is disposed and the poly silicon gate electrode 212 is located thereon. Thereafter, as shown in FIG. 43 the p well region 214 is generated by the ion implantation to penetrate the n well region 210 and reaches the p well region 209. Then, as shown in FIG. 44 the n++ region 241 is made by the ion implantation. Moreover, as shown in FIG. 35, the n+ source region 215, the n+ region 217 and the n+ region 242 are concurrently formed after the formation of the p+ regions 216 and 244.

A description will be taken hereinbelow of a modification of the above-described sixth and seventh embodiments.

Figure 45:
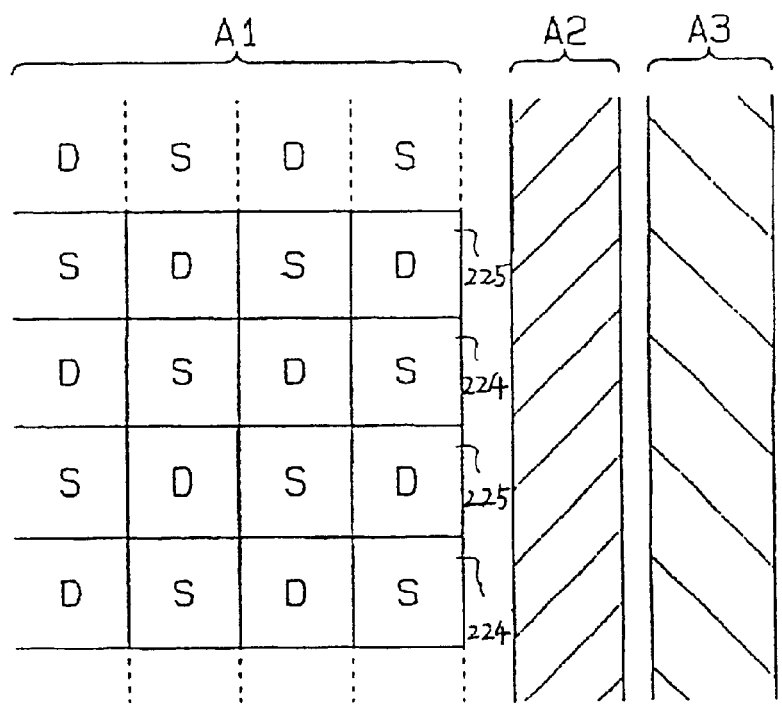
FIG. 45 is a plan view showing a different structure of a power MOS transistor.
Figure 46:
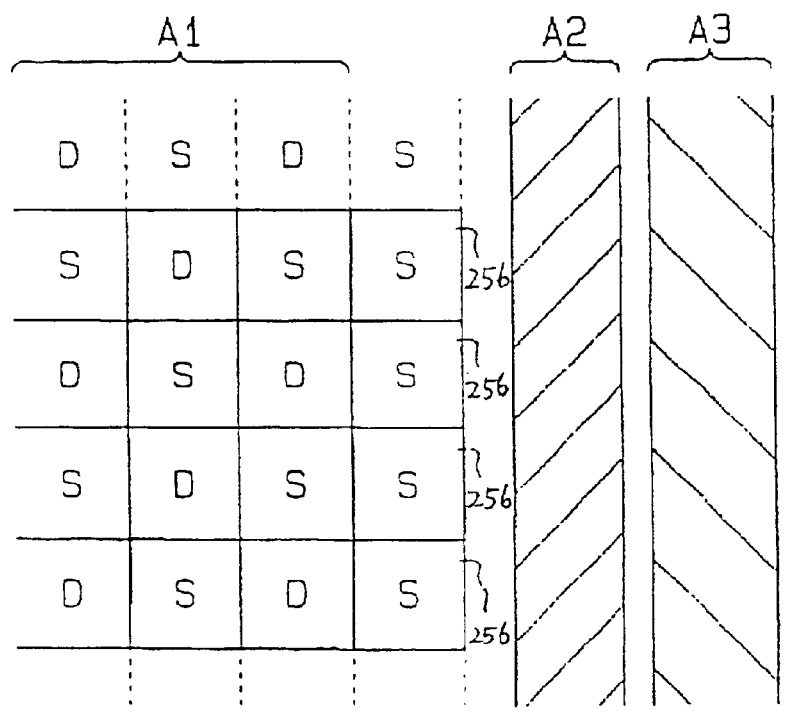
FIG. 46 is a plan view showing a different structure of a power MOS transistor.

Although in the above description the drain cells 225 and the source cells 224 are alternately arranged in the longitudinal and transverse directions (checkers) as shown in FIG. 45, it is also appropriate that as shown in FIG. 46 cells adjacent to the surge absorption area A2 in the source and drain cell formation area A1 are disposed as dummy source cells 256. That is, a second surge draw area comprising the dummy source cells 256 is placed between the source and drain cell formation area A1 and the surge absorption area A2. Whereupon, a portion of the surge current is drawn through the dummy source cells 256. In this case, it is possible to enlarge the area for the surge current draw, thereby more improving the withstand.

Figure 47:
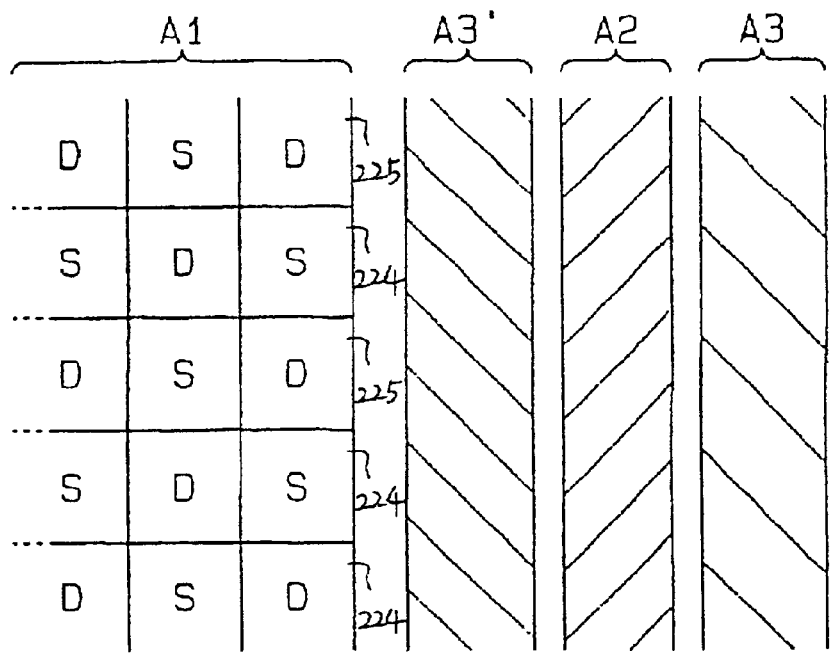
FIG. 47 is a plan view showing a different structure of a power MOS transistor.

Furthermore, although in the above description, as shown in FIGS. 27 and 45, in the silicon chip 201 the ring-like surge absorption area A2 is formed around the source and drain cell formation area A1 and further the surge draw area A3 is formed around it, it is also appropriate that as shown in FIG. 47 a second surge draw area A3' is made between the source and drain cell formation area A1 and the surge absorption area A2.

Figure 48:
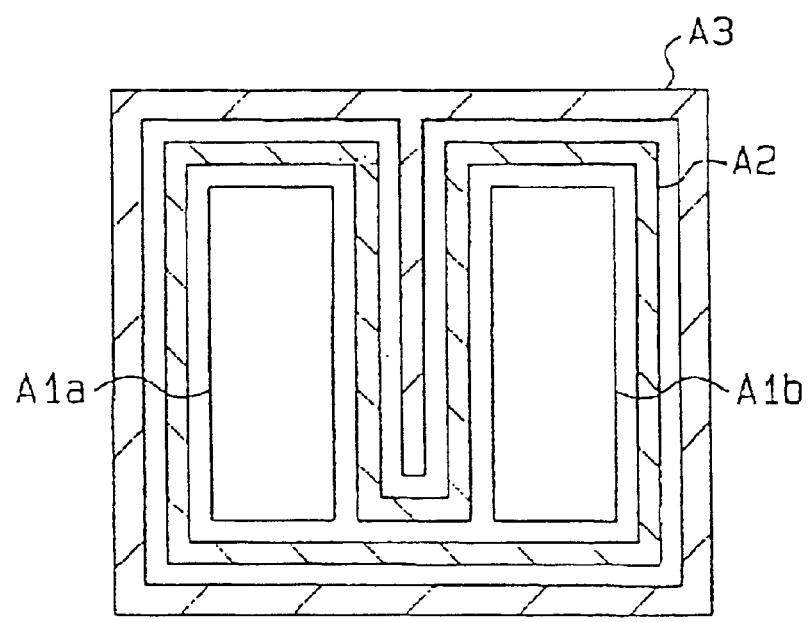
FIG. 48 is a plan view showing a different structure of a power MOS transistor.
Figure 49:
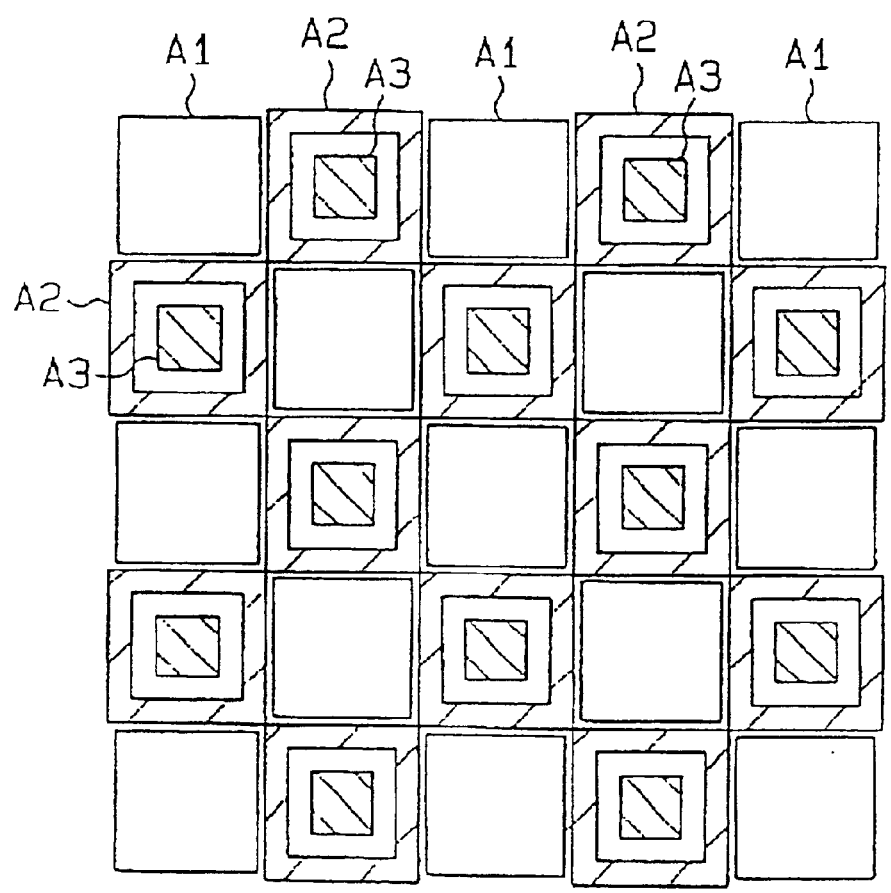
FIG. 49 is a plan view showing a different structure of a power MOS transistor.
Figure 50:
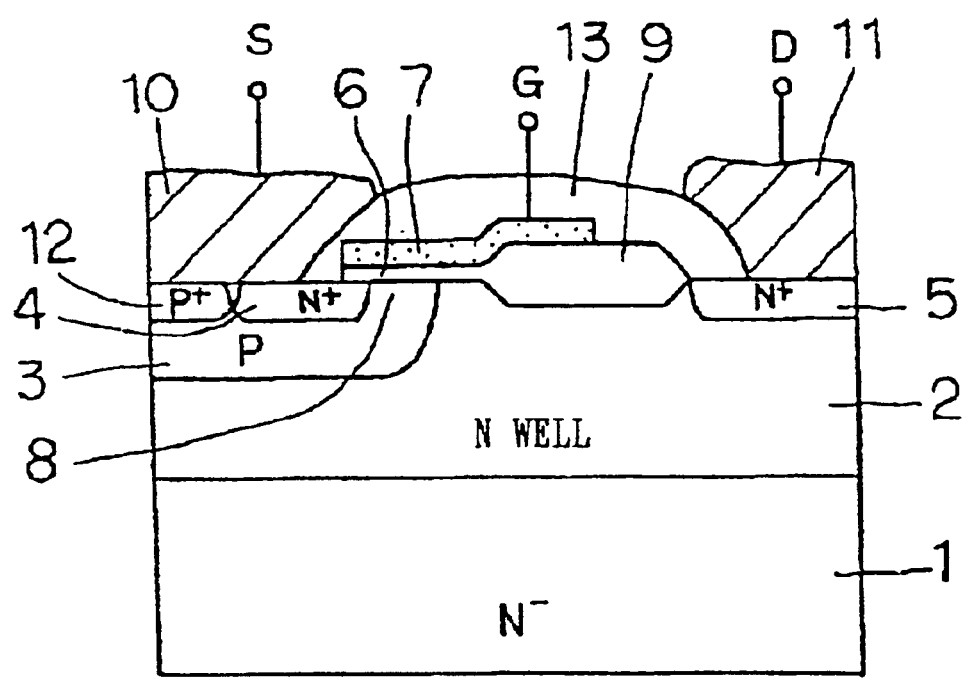
FIG. 50 is a cross-sectional view showing a structure of a prior LDMOS.

Still further, it is also possible that, as shown in FIG. 48, in the silicon chip 201 a ring-like surge absorption area A2 is formed around source and drain cell formation areas A1a, A1b and further a surge draw area A3 is formed around the surge absorption area A2. Besides, it is also possible that as shown in FIG. 49 source and drain cell formation areas A1 are formed into island-like configurations, ring-like surge absorption area A2 are formed between the island-like cell formation areas A1 and even a square surge draw area A3 is made inside the surge absorption area A2.

Moreover, although the third to seventh embodiments described above are based upon the use of the joined SOI wafer substrate, even the common mere epitaxial wafer can provide the similar effects. In addition, although the above-described third to seventh embodiments are applied to the n channel LDMOS, it is also appropriate that the embodiments are also applicable to a p channel LDMOS. That is, the conductive types (p, n) of the n channel MOS are interchangeable.

It should be understood that the foregoing relates to only preferred embodiments of the present invention, and that it is intended to cover all changes and modifications of the embodiments of the invention herein used for the purpose of the disclosure, which do not constitute departures from the spirit and scope of the invention.

What is claimed is:

1. A semiconductor device having a power transistor structure comprising:

a semiconductor layer of a first conductivity type;

a plurality of first wells of a second conductivity type disposed independently at a surface portion of said semiconductor layer;

a drain cell disposed in each of said first wells, said drain cell comprising a second well of the first conductivity type disposed within a corresponding first well and a drain region disposed within said second well;

a source cell disposed in each of said first wells, said source cell comprising a channel well region of the second conductivity type disposed within said corresponding first well and a source region of the first conductivity type disposed within said channel well region;

a gate electrode disposed over a surface portion of said channel well region between said source region and said second well where said drain region is disposed;

a deep region of the first conductivity type, said deep region having a portion disposed in said semiconductor layer between said first wells;

a drain electrode connected to respective drain regions in said second wells;

a source electrode connected to respective source regions and channel well regions in said first wells;

either said drain electrode or said source electrode being connected to an inductive load; and a connecting member configurable to connect said being region to a source potential when said drain electrode is connected to said inductive load or to a drain potential when said source electrode is connected to said inductive load.

2. A device as defined in claim 1, wherein said inductive load is connected to said drain electrode to establish a low-side switch type, and said connecting member is an electrode which contacts said deep region and is electrically connected to said source electrode.

3. A device as defined in claim 1, wherein a load is connected to said source region to establish a high-side switch type and said drain electrode is electrically connected to said drain region.

4. A device as defined in claim 1, wherein said source cell comprises a base region of the second conductivity type disposed to overlap with a portion of said channel well region beneath said source region and contact down to said corresponding first well.

5. A device as defined in claim 1, wherein said semiconductor layer comprises an upper layer having a relative low impurity concentration and encompassing said first wells, and a lower layer having a relatively high impurity concentration and disposed entirely under said first wells with said upper layer interposed therebetween.

6. A device as defined in claim 5, wherein said deep region is disposed in said upper layer of said semiconductor layer to contact down to said lower layer of said semiconductor layer.

7. A device as defined in claim 1, wherein said deep region has a layout pattern surrounding each of said first wells.

8. A device as defined in claim 1, wherein said deep region has a layout pattern which forms a stripe pattern in association with said first wells.

9. A device as defined in claim 1, wherein said deep region has a layout pattern, an interval between adjoining deep regions being below 200 microns.

10. A device as defined in claim 1, wherein said semiconductor layer and said first wells are disposed within a semiconductor island which is disposed on a supporting semiconductor substrate with an insulation film interposed therebetween.

* * * * *

UNITED STATES PATENT AND TRADEMARK OFFICE
CERTIFICATE OF CORRECTION

PATENT NO.    : 6,831,331 B2
DATED         : December 14, 2004
INVENTOR(S)   : Kenji Kohno et al.

It is certified that error appears in the above-identified patent and that said Letters Patent is hereby corrected as shown below:

Title page,
Item [75], Inventors, delete "Yasuhiro Kitamura, Toshio Sakakibara, Yoshiaki Nakayama, Hiroshi Maeda, Hiroshi Fujimoto, Mitsuhiro Saitou, Hiroshi Imai, Hiroyuki Ban"

Column 25,
Line 3, "being" should be -- deep --
Line 23, "relative" should be -- relatively --

Signed and Sealed this

Seventeenth Day of May, 2005

JON W. DUDAS
*Director of the United States Patent and Trademark Office*